US010748602B2

(12) United States Patent
Liu et al.

(10) Patent No.: US 10,748,602 B2
(45) Date of Patent: Aug. 18, 2020

(54) NONVOLATILE SRAM

(71) Applicant: Intel Corporation, Santa Clara, CA (US)

(72) Inventors: Huichu Liu, San Jose, CA (US); Sasikanth Manipatruni, Portland, OR (US); Daniel H. Morris, Hillsboro, OR (US); Kaushik Vaidyanathan, Santa Clara, CA (US); Niloy Mukherjee, Portland, OR (US); Dmitri E. Nikonov, Beaverton, OR (US); Ian Young, Portland, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/079,400

(22) PCT Filed: Mar. 23, 2016

(86) PCT No.: PCT/US2016/023699
§ 371 (c)(1),
(2) Date: Aug. 23, 2018

(87) PCT Pub. No.: WO2017/164859
PCT Pub. Date: Sep. 28, 2017

(65) Prior Publication Data
US 2019/0013063 A1 Jan. 10, 2019

(51) Int. Cl.
*G11C 11/00* (2006.01)
*G11C 11/413* (2006.01)
(Continued)

(52) U.S. Cl.
CPC .......... *G11C 11/413* (2013.01); *G11C 7/1057* (2013.01); *G11C 11/412* (2013.01);
(Continued)

(58) Field of Classification Search
CPC ... G11C 11/413; G11C 7/1057; G11C 11/412; G11C 13/0007; G11C 14/009; G11C 7/1045
(Continued)

(56) References Cited

U.S. PATENT DOCUMENTS 10,163,505 B2 * 12/2018 Lee ..................... G11C 13/0026
2008/0229269 A1 9/2008 Lamorey et al.
(Continued)

FOREIGN PATENT DOCUMENTS

WO 2017164859 A1 9/2017

OTHER PUBLICATIONS

Hraziia et al, "Operation and stability analysis of bipolar OxRRAM-based Non-Volatile 8T2R SRAM as solution for information backup," Solid-State Electronics, vol. 90, 2013.
(Continued)

*Primary Examiner* — Huan Hoang
(74) *Attorney, Agent, or Firm* — Grossman, Tucker, Perreault & Pfleger, PLLC

(57) ABSTRACT

One embodiment provides an apparatus. The apparatus includes a pair of nonvolatile resistive random access memory (RRAM) memory cells coupled to a volatile static RAM (SRAM) memory cell. The pair of nonvolatile RRAM memory cells includes a first RRAM memory cell and a second RRAM memory cell. The first RRAM memory cell includes a first resistive memory element coupled to a first bit line, and a first selector transistor coupled between the first resistive memory element and a first output node of the volatile SRAM memory cell. The second RRAM memory cell includes a second resistive memory element coupled to a second bit line, and a second selector transistor coupled between the second resistive memory element and a second output node of the volatile SRAM memory cell.

16 Claims, 7 Drawing Sheets

(51) Int. Cl.
| | |
|---|---|
| *G11C 11/412* | (2006.01) |
| *G11C 7/10* | (2006.01) |
| *G11C 13/00* | (2006.01) |
| *G11C 14/00* | (2006.01) |
| *G11C 7/20* | (2006.01) |

(52) U.S. Cl.
CPC ........ *G11C 13/0007* (2013.01); *G11C 14/009* (2013.01); *G11C 7/1045* (2013.01); *G11C 7/20* (2013.01); *G11C 2213/70* (2013.01); *G11C 2213/71* (2013.01)

(58) Field of Classification Search
USPC ........................................ 365/154, 148, 156
See application file for complete search history.

(56) References Cited

U.S. PATENT DOCUMENTS

| | | | |
|---|---|---|---|
| 2009/0109734 A1 | 4/2009 | Hanafi et al. | |
| 2011/0085372 A1 | 4/2011 | Fackenthal et al. | |
| 2013/0168631 A1 | 7/2013 | Chen et al. | |
| 2015/0340090 A1* | 11/2015 | Ma | G11C 13/0069 365/148 |
| 2016/0071582 A1* | 3/2016 | Chung | G11C 11/1675 365/96 |
| 2018/0033483 A1* | 2/2018 | Bertin | B82Y 10/00 |

OTHER PUBLICATIONS

Chiu et al, "Low Store Energy,Low VDDmin, 8T2R Nonvolatile Latch and SRAM With Vertical-Stacked Resistive Memory (Memristor) Devices for Low Power Mobile Applications," Solid-State Circuits, IEEE Journal of, vol. 47, No. 6, 2012.

Sheuetal, "A ReRAM integrated 7T2R non-volatile SRAM for normally-off computing application", Solid-State Circuits Conference (A-SSCC), 2013 IEEE Asian.

Wang et al,"Nonvolatile SRAM cell", In Electron devices meeting, IEDM, 2006.

Chiu et al,"A low store energy, low VDD min, non-volatile 8T2R SRAM with 3D stacked RRAM devices for low power mobile applications", In IEEE symp. VLSI,2010.

Zangeneh et al,"Design and Optimization of Nonvolatile Multibit 1T1R Resistive RAM", Very Large Scale Integration (VLSI) Systems, IEEE Transactions on, 2014.

International Search Report and Written Opinion, received in PCT/US2016/023699, dated Dec. 21, 2016, 8 pages.

International Preliminary Report on Patentability, received in PCT/US2016/023699, dated Sep. 25, 2018, 7 pages.

* cited by examiner

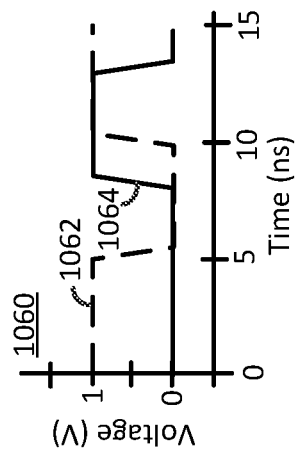
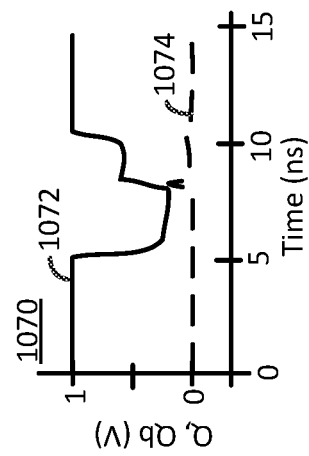
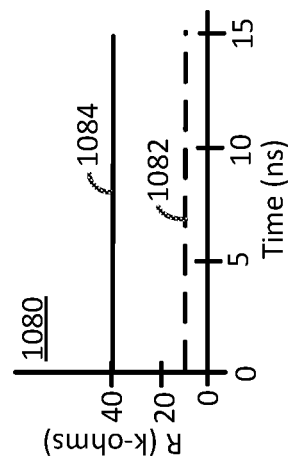
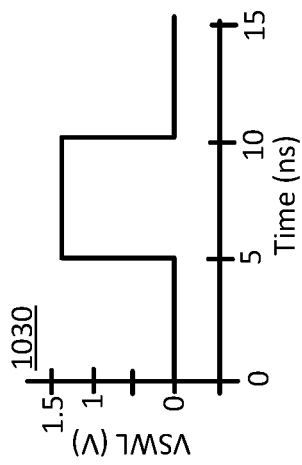
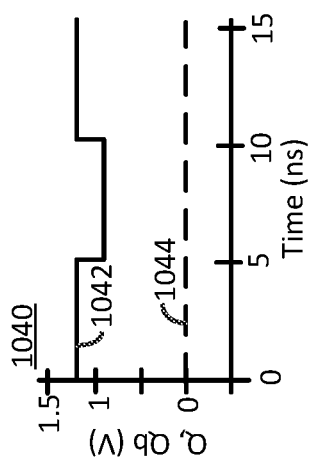
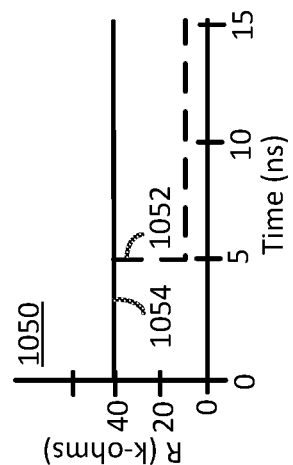
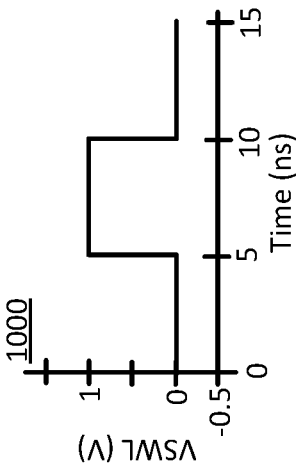
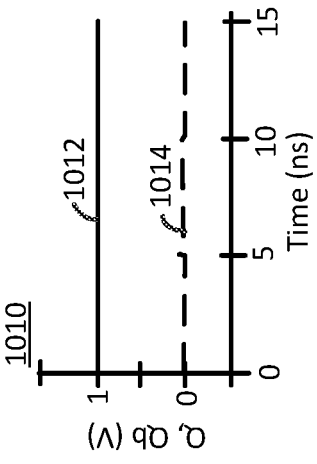
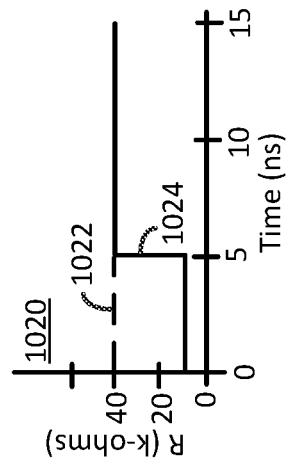
FIG. 11
FIG. 12
FIG. 13

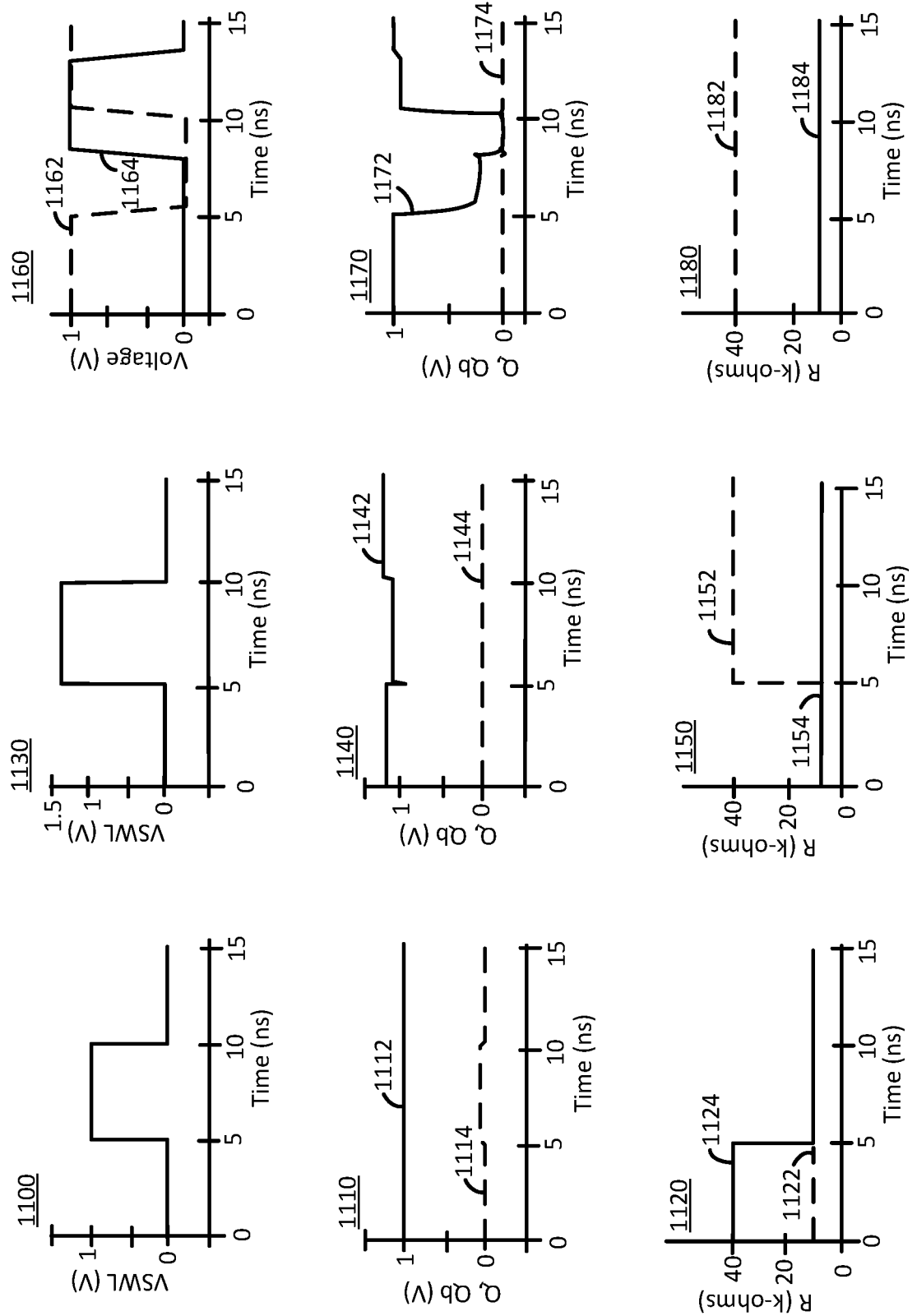

NONVOLATILE SRAM

FIELD

The present disclosure relates to SRAM (static random access memory), in particular to, non-volatile SRAM.

BACKGROUND

SRAM (static random access memory) is volatile, meaning that SRAM memory cells maintain their programmed states as long as power is supplied to the SRAM memory cell and lose their stored data when power is removed. Although SRAM memory cells typically do not need to be refreshed (i.e. data rewritten) in order to maintain their programmed states, the SRAM memory cells consume energy while maintaining their states. SRAM may be utilized in computing systems, for example, for cache memory.

Some computing systems, including, for example, battery-powered systems, embedded systems and/or systems on a chip (SOC), may be configured to transition processing elements and cache memory to a low power "sleep" state to reduce power consumption when a processor and/or processing unit is idle. In order to preserve data stored in SRAM, such data may be copied to nonvolatile storage, e.g., flash memory or hard disk drive, prior to entering the low power state. The stored data may be retrieved from the nonvolatile storage after exiting the low power state and restored to the SRAM. Thus, data may not be lost, power consumption may be reduced and energy efficiency may be improved.

BRIEF DESCRIPTION OF DRAWINGS

Features and advantages of the claimed subject matter will be apparent from the following detailed description of embodiments consistent therewith, which description should be considered with reference to the accompanying drawings, wherein:

FIGS. 11 through 13 are plots of simulation data for a Type 1 nonvolatile SRAM memory cell; and FIGS. 14 through 16 are plots of simulation data for a Type 2 nonvolatile SRAM memory cell.

Figure 1:
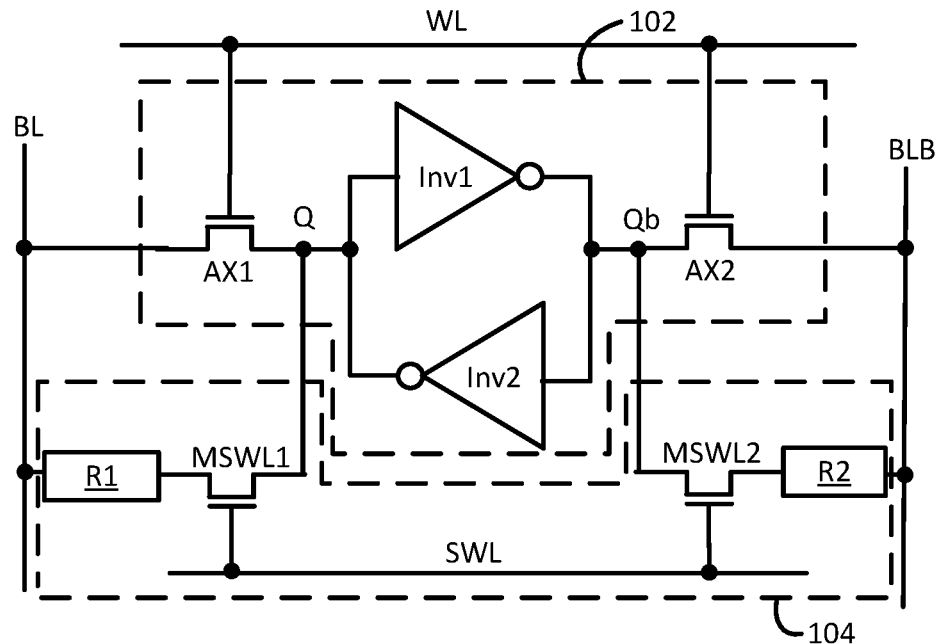
FIG. 1 illustrates a functional block diagram of a nonvolatile SRAM (static random access memory) memory cell consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

A processor may contain a plurality of processing units, i.e., cores. The processor may further contain and/or be coupled to one or more levels of cache memory. For example, each core may be coupled to a respective level 1 (L1) cache and one or more cores may be coupled to a level 2 (L2) cache. A computing system may have a plurality of power states, e.g., C-states, related to an operational status of the processor and/or cores. For example, C0 may correspond to an active state, i.e., the corresponding core is actively executing, while C1, C2, . . . may correspond to idle states when the core is not actively executing. Each idle C state may correspond to a reduced power state with the amount of power reduction related to the C number. The amount of power reduction is further related to the elements of the corresponding core and/or associated cache memory that are in a low power state. For example, C6 may correspond to core and L2 cache being in a low power state.

Prior to powering down a cache memory, data stored in the cache memory (e.g., SRAM) may be written to nonvolatile storage. The data written to the nonvolatile storage may then be retrieved as part of operations associated with exiting from the low power state and returning to the active state. For off chip nonvolatile storage, i.e., flash memory and/or hard disk drives, latencies associated with writing data to the nonvolatile storage can be rather lengthy. Thus, a core may be maintained in an idle state without powering down, e.g., L2 cache, to avoid the latencies. Incorporating nonvolatile storage on chip, e.g., with the cache memory, may reduce such latencies. Utilizing a nonvolatile storage technology such as resistive random access memory may also reduce the latencies. Reduced latencies may facilitate energy efficiency by supporting more frequent entry into a low power state.

Generally, this disclosure relates to a non-volatile SRAM (static random access memory) memory cell. The nonvolatile SRAM memory cell includes a 6T (six transistor) volatile SRAM memory cell and two (i.e., a pair of) 1T1R (one selector transistor, one resistive memory element) nonvolatile resistive RAM (RRAM) memory cells. The pair of nonvolatile RRAM memory cells is configured to provide on-chip nonvolatile storage to the volatile SRAM memory cell.

A first nonvolatile RRAM memory cell includes a first selector transistor and a first resistive memory element. A second nonvolatile RRAM memory cell includes a second selector transistor and a second resistive memory element. The first selector transistor is coupled between a first output (i.e., data) node of the volatile SRAM memory cell and the first resistive memory element. The first resistive memory element is further coupled to a first bit line BL. The second selector transistor is coupled between a second output node of the volatile SRAM memory cell and the second resistive memory element. The second resistive memory element is further coupled to a second bit line BLB. Control inputs of the first selector transistor and second selector transistor are coupled to a selector word line SWL. Coupling the resistive elements between the bit lines and selector transistors is configured to avoid through vias, as described herein.

Each resistive memory element has two states: a high resistance state (HRS) and a low resistance state (LRS). The respective state of each resistive memory element may be controlled by application of an appropriate (i.e., magnitude and polarity) voltage to the RRAM memory cell and, thus, the resistive memory element. An effect of the polarity of the applied voltage is related to a configuration of the respective resistive memory element. For example, each resistive memory element may include a plurality of layers. The plurality of layers may include an oxygen exchange layer (OEL) and a location of the OEL in the plurality of layers relative to the associated bit line determines the relationship between the polarity of the applied voltage and the resulting resistance value of the associated resistive memory element. The resulting states of the two resistive memory elements correspond to the stored data from the corresponding nonvolatile SRAM memory cell, as described herein.

The nonvolatile SRAM memory cell is configured to be compatible with one or more advanced CMOS (complementary metal oxide semiconductor) fabrication processes. As used herein, "advanced CMOS" corresponds to semiconductor device dimension, e.g., metal layer M1 feature size, of less than or equal to 20 nm (nanometer). Aspect ratio constraints associated with advanced CMOS may be accommodated by fabricating each resistive memory element in a plurality of adjacent back end layers. Each resistive memory element is configured to occupy a plurality of adjacent back end layers of a monolithic integrated circuit. A corresponding front end layer of the monolithic integrated circuit may contain each respective associated selector transistor and the transistors of the nonvolatile SRAM memory cell.

As used herein, "back end" corresponds to "back end of the line" (BEOL) processing related to fabricating interconnections, e.g., metal traces and/or vias in an integrated circuit. As used herein, "front end" corresponds to "front end of the line" (FEOL) processing related to fabricating devices, e.g., transistors, resistors, etc., in an integrated circuit. As used herein, a "through via" is a via whose height is more than the height of a standard via. A standard via spans two process layers and is configured to connect inter-layer elements. A through via spans multiple back end layers and may be utilized to connect between front end nodes and/or between different dies. As used herein, "monolithic integrated circuit" corresponds to devices and interconnects fabricated on a same die using CMOS processing techniques.

An apparatus, method and/or system are configured to provide on-chip nonvolatile storage for each volatile SRAM memory cell. During operation, power management logic may be configured to store data contained in a volatile SRAM memory cell to an associated pair of nonvolatile RRAM memory cells prior to entering a sleep, i.e. low power, state. The power management logic may be further configured to restore the stored data from the pair of nonvolatile RRAM memory cells to the volatile SRAM memory cell upon exiting the low power state. Thus, speed and endurance associated with volatile SRAM memory cells may be preserved during normal operation and on chip nonvolatile storage may be utilized to support corresponding low power states. Thus, latencies associated with storing SRAM data to off-chip storage such as flash memory and/or a hard disk drive may be avoided.

Through vias to couple the pair of nonvolatile RRAM memory cells to the volatile SRAM memory cells may be avoided, thus, facilitating (e.g., enabling) monolithic integration of the pair of nonvolatile RRAM memory cells and the volatile SRAM memory cell. Nonvolatile SRAM memory cells, consistent with the present disclosure, may thus be fabricated using advanced CMOS processes. A nonvolatile SRAM memory cell, consistent with the present disclosure, may be utilized to provide on-chip nonvolatile storage for, e.g., cache memory, processor registers and/or flip flops. Energy efficiency may be enhanced by facilitating utilization of low power states while maintaining data integrity.

FIG. 1 illustrates a functional block diagram of a nonvolatile SRAM memory cell 100 consistent with several embodiments of the present disclosure. The nonvolatile SRAM memory cell 100 includes a volatile SRAM memory cell 102 and a pair 104 of nonvolatile RRAM memory cells. The volatile SRAM memory cell 102 includes a pair of cross coupled inverters Inv1, Inv2, coupled to a pair of access transistors AX1, AX2. The access transistors AX1, AX2 are configured to control access to the volatile SRAM memory cell 102. For example, the access transistors AX1, AX2 may be MOSFETs (metal oxide semiconductor field effect transistors). A respective gate electrode of each access transistor AX1, AX2 is coupled to a word line (WL), a drain electrode of the first access transistor AX1 is coupled to a first bit line (BL) and a source electrode of the second access transistor AX2 is coupled to a second bit line (BLB). A source electrode of the first access transistor AX1 is coupled to the pair of inverters Inv1, Inv2 at a first data node Q (i.e., output node) and a drain electrode of the second access transistor AX2 is coupled to the pair of inverters Inv1, Inv2 at a second data node Qb (i.e., inverted output node).

In operation, the volatile SRAM memory cell 102 may be selected for memory access operations, by, e.g., a memory controller, by coupling appropriate control inputs to the word line WL configured to turn on the access transistors AX1, AX2. Data may then be stored to and/or read from volatile SRAM memory cell 102 by applying a differential voltage across the bit line pair BL, BLB and/or reading a differential voltage across the bit line pair BL, BLB. The volatile SRAM memory cell 102 is configured to maintain the stored data as long as the cross coupled inverters Inv1, Inv2 remain powered, i.e., while in an active state.

The pair 104 of nonvolatile RRAM memory cells includes a first resistive memory element R1 coupled to a first selector transistor MSWL1 and a second resistive memory element R2 coupled to a second selector transistor MSWL2. For example, the selector transistors MSWL1, MSWL2 may be MOSFETs. A gate electrode of each selector transistor MSWL1, MSWL2 is coupled to a selector word line SWL. The first selector transistor is coupled between the first output (i.e., data) node Q of the volatile SRAM memory cell 102 and the first resistive memory element R1. The first resistive memory element R1 is coupled between the first bit line BL and a source electrode of the first selector transistor MSWL1. A drain electrode of the first selector transistor MSWL1 is coupled to the first data node Q. The second selector transistor is coupled between the second output (i.e., data) node Qb of the volatile SRAM memory cell 102 and the second resistive memory element R2. The second resistive memory element R2 is coupled between the second bit line BLB and a drain of the second selector transistor MSWL2. A source electrode of the second selector transistor MSWL2 is coupled to the second data node Qb.

The inverters Inv1, Inv2 and the transistors AX1, AX2, MSWL1, MSWL2 may be fabricated in front end layers of a front end process. The resistive memory elements R1, R2 may be fabricated in a plurality of back end layers in a back end process, as described herein. In other words, coupling the resistive memory elements R1, R2 between respective selector transistors and respective bit lines rather than between respective selector transistors and respective output nodes Q, Qb is configured to avoid utilizing through vias and to facilitate monolithic integration of the nonvolatile RRAM memory cells with the volatile SRAM memory cell.

During "normal" operation, i.e., in an active state, when neither entering nor exiting a low power state, the selector transistors MSWL1, MSWL2 are in an off state and the resistive memory elements R1, R2 are decoupled from the nonvolatile SRAM memory cell 102. The volatile SRAM memory cell 102 may then operate independent of the pair 104 of nonvolatile RRAM memory cells. In advance of entering a low power state, data from the volatile SRAM memory cell 102 may be stored to the pair 104 of nonvolatile RRAM memory cells by controlling the selector transistors MSWL1, MSWL2, via selector word line SWL to couple the resistive memory elements R1, R2 to the data nodes Q, Qb and coupling appropriate voltage(s) to bit lines pair BL and BLB. The appropriate applied voltages are related to the respective polarities of the resistive memory elements R1, R2, as described herein. Whether an applied voltage greater than a threshold voltage results in the resistive memory element being in a high resistance state (i.e., reset) or in a low resistance state (i.e., set) is related to a polarity of the resistive memory element and an orientation of the resistive memory element relative to its associated selector transistor and associated bit line. The polarity of the resistive memory element is related to the location of the OEL in the layers of the resistive memory element, as described herein.

Figure 2:
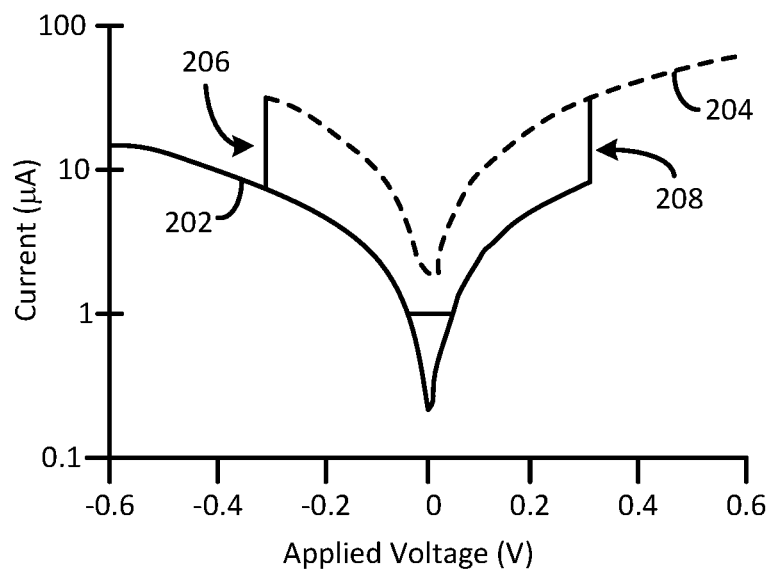
FIG. 2 is a plot of a current versus applied voltage relationship for one example resistive memory element.

FIG. 2 is a plot 200 of a current versus applied voltage relationship for one example resistive memory element. A resistance of a resistive memory element corresponds to stored data. A high resistance state (HRS), e.g., curve 202, may correspond to a logic zero and a low resistance state (LRS), e.g., curve 204, may correspond to a logic one. A resistive memory element may be set, i.e., transitioned from an HRS to a LRS 208, by applying a voltage greater than a set voltage (Vset). The resistive memory element may be reset, i.e., transitioned from a LRS to an HRS 206, by applying a voltage less than a reset voltage (Vreset) (i.e., by applying a negative voltage whose magnitude is greater than the magnitude of the reset voltage). The state of the resistive memory element may then be read by applying a voltage greater than the reset voltage and less than the set voltage and detecting a corresponding current. For the example of plot 200, the HRS corresponds to a resistance of 40 kilo-ohms (kΩ), the LRS corresponds to a resistance of 10 kΩ and the magnitude of Vreset (i.e., |Vreset|) equals Vset and is approximately equal to 0.3 V. The state of the resistive memory element may be maintained whether or not power is applied to the resistive memory element. Values of resistances associated with the HRS and LRS and values and polarities of threshold voltages, Vset and Vreset, may be determined based, at least in part, on material selection, layer configuration of the resistive memory elements and/or orientation of the resistive memory element.

Figure 3:
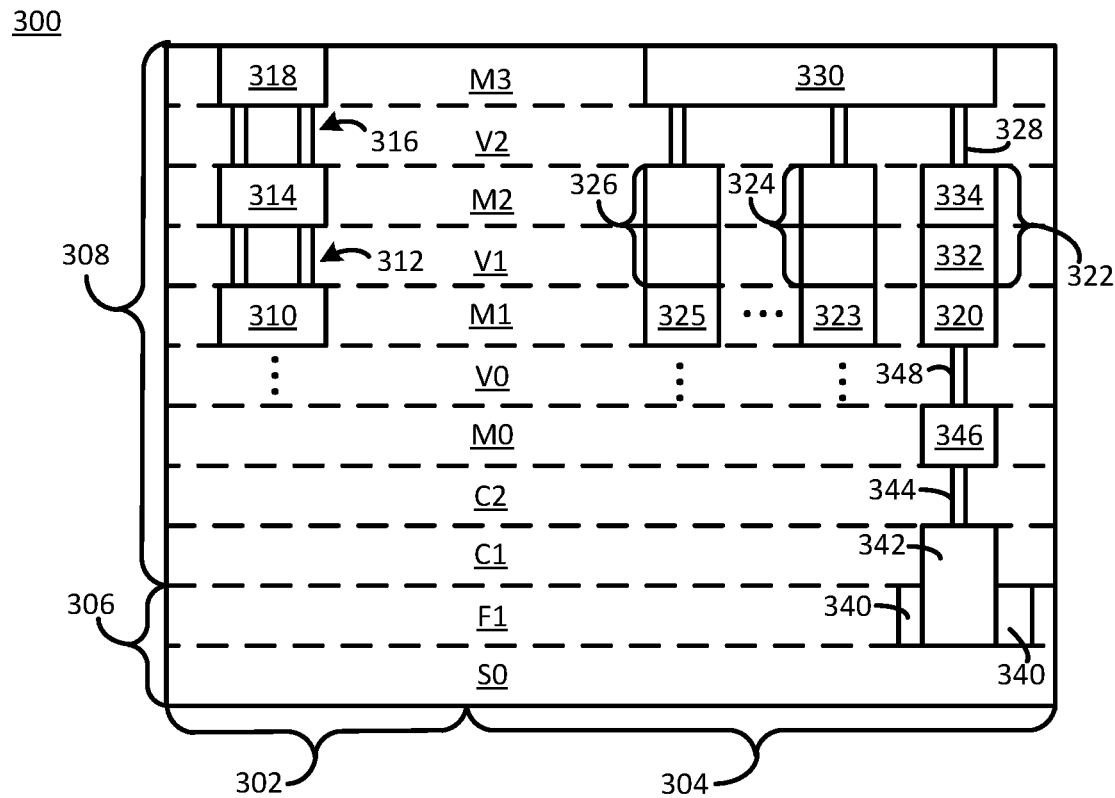
FIG. 3 illustrates a layer structure for a monolithic integrated circuit consistent with several embodiments of the present disclosure.

FIG. 3 illustrates a layer structure 300 for a monolithic integrated circuit consistent with several embodiments of the present disclosure. Structure 300 includes a CMOS region 302 and an RRAM region 304. The CMOS region 302 may contain components (e.g., transistors) of a processor and/or processing unit and associated interconnects. The RRAM region 304 may contain nonvolatile SRAM memory elements, as described herein.

Structure 300 includes a front end portion 306 and a back end portion 308. The front end portion 306 includes one or more layers that contain a substrate and front end elements including, but not limited to, transistors. The front end portion 306 may include one or more contacts and/or contact layers. Contacts are configured to provide electrical contact to front end elements and may include and/or correspond to electrodes.

The back end portion 308 includes a plurality of layers configured to contain interconnects, e.g., vias and/or conductive traces, and/or insulating dielectric material. The back end portion 308 may include one or more contact layers. The conductive traces, e.g., "metal lines", may be formed of one or more conductive materials, e.g., metals. Vias are configured to provide connections between conductive traces contained in different layers and conductive traces provide connections between vias. The back end portion 308 may further contain dielectric material separating conductive traces and/or vias. The back end portion 308 further includes resistive memory elements, as described herein.

Structure 300 includes a substrate S0 that may be silicon. The substrate S0 corresponds to a bottom-most layer. As used herein, "bottom" and "top" are related to relative layer position and do not necessarily correspond to orientation in space. Structure 300 further includes a front end layer F1 configured to contain a plurality of components, e.g., transistors, and may contain resistors and/or capacitors. In other words, the plurality of components may be fabricated in or on front end layer F1.

The back end portion 308 includes a first contact layer C1 adjacent the front end layer F1 and a second contact layer C2 adjacent the first contact layer C1. The back end portion 308 further includes alternating metal and via layers beginning with a first metal layer M0 adjacent the second contact layer C2 and a first via layer V0 adjacent the first metal layer M0 and ending with a fourth metal layer M3. Thus, structure 300 includes, in order from bottom to top, substrate S0 and layers F1, C1, C2, M0, V0, M1, V1, M2, V2 and M3. Structure 300 may further include additional alternating via layers and metal layers on top of the fourth metal layer M3 (not shown).

For example, CMOS region 302 may contain a first metal trace 310 included in metal layer M1, a plurality of vias 312 included in via layer V1, a second metal trace 314 included in metal layer M2, a plurality of vias 316 included in via layer V2 and a third metal trace 318 included in metal layer M3. Vias 312 may couple first metal trace 310 and second metal trace 314. Vias 316 may couple second metal trace 314 and third metal trace 318. The first metal trace 310 may be ultimately coupled to front end elements (not shown) included in front end layer F1.

Features, e.g., conductive traces, vias, contacts and/or components, may be formed, i.e., fabricated, using one or more CMOS processes. CMOS processes may include, but are not limited to, chemical deposition, metal formation (i.e., metallization), oxidation, lithography, etching, ion implantation, damascene process, and/or chemical mechanical polishing. For example, a "feature size" (i.e., a smallest metal width at layer M1 and/or a half pitch of a DRAM (dynamic random access memory) memory cell) for advanced CMOS (e.g., a technology generation of 22 nm node and beyond) may be less than or equal to 20 nm. A minimum size of a lithography feature may increase for layers relatively more distant from the substrate S0, related to the etching process aspect ratio limitations for connecting elements through these layers. An actual size of a lithography feature may be determined by a horizontal dimension perpendicular to the top-bottom (i.e., vertical) direction. Hence, shrinking a feature size in advanced CMOS may constrain the height of the M1 layer as well as other layers in order to achieve or maintain a defined aspect ratio for etching through the layers. For example, the aspect ratio may be in the range of 1:1 to 20:1.

RRAM region 304 includes metal trace 330 contained in metal layer M3. For example, the metal trace 330 may correspond to a bit line, e.g., bit line BL or BLB of FIG. 1. A plurality of resistive memory elements 322, 324, 326 may be coupled to bit line 330 by respective vias, e.g., via 328, included in via layer V2. Each of the resistive memory elements 322, 324, 326, e.g., resistive memory element 322, may occupy, i.e., be contained in, a plurality of adjacent back end layers, e.g., layers M2 and V1. A first portion of each resistive memory element, e.g., first portion 332 of resistive memory element 322, may be contained in the second via layer V1. A second portion of each resistive memory element, e.g., second portion 334 of resistive memory element 322, may be contained in the third metal layer M2 that is adjacent the second via layer V1. Occupying the plurality of adjacent back end layers enables fabrication of the resistive memory elements in an advanced CMOS process. In other words, feature size constraints and aspect ratio constraints may be accommodated while avoiding through vias.

Each resistive memory element 322, 324, 326 may be coupled to a respective metal feature 320, 323, 325 included in the second metal layer, M1. The metal features 320, 323, 325 are configured to provide a mechanical support, e.g., a landing pedestal, for the respective resistive memory elements 322, 324, 326. Each landing pedestal, e.g., landing pedestal 320, is further coupled to a metal feature included in metal layer M0 by a via included in via layer V0, e.g., metal feature 346 included in layer M0 by via 348 included in layer V0. Metal feature 346 is coupled to a selector transistor 340 included in front end layer F1 by contacts 344, 342 included in the second contact layer C2 and the first contact layer C1, respectively.

Thus, a resistive memory element, e.g., resistive memory element 322, may be contained in a plurality of adjacent back end layers. The resistive memory element may be coupled between an associated selector transistor, e.g., selector transistor 340, included in a front end layer and a bit line, e.g., metal trace 330, included in a back end layer, thus avoiding through vias. Fabricating the resistive memory element in the plurality of back end layers is configured to facilitate compliance with one or more CMOS processing rules, e.g., feature size and aspect ratio, for advanced CMOS. Thus, volatile SRAM memory cells and nonvolatile RRAM memory cells that include resistive memory elements, e.g., resistive memory element 322, may be included in a monolithic integrated circuit fabricated using an advanced CMOS process.

Figure 4:
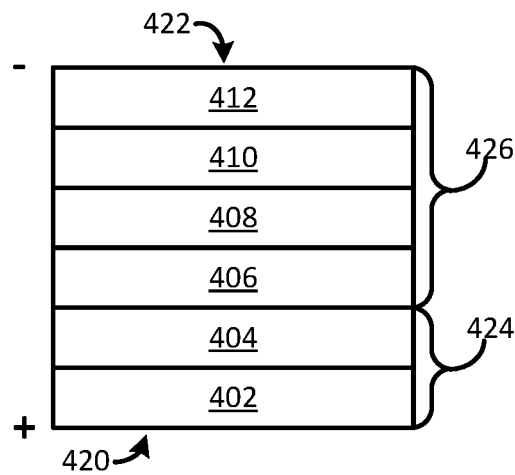
FIG. 4 illustrates a layer structure of an example resistive memory element.

FIG. 4 illustrates a layer structure of an example resistive memory element 400. Layer structure 400 includes six layers bounded by a first contact 420 and a second contact 422. Resistive memory element 400 is one example of resistive memory element 322 of FIG. 3. A first layer 402 is a work function matching layer. A second layer 404 is a barrier layer. A third layer 406 is an oxygen exchange layer (OEL). A fourth layer 408 is an oxide layer. A fifth layer 410 is another barrier layer. A sixth layer 412 is another work function matching layer.

Work function matching layers 402, 412 may contain one or more metal materials. The metal materials may include, but are not limited to, Ta (tantalum), Hf (hafnium), Ti (titanium), TiN, TaN (tantalum nitride), TiAlN (titanium aluminum nitride), TaAlN (tantalum aluminum nitride), and or alloys, and or combinations thereof. The work function matching layers 402, 412 are configured to reduce contact resistance.

The barrier layers 404, 410 may or may not be included. Whether the barrier layers 404, 410 are included is related to characteristics of an interconnect material or pedestal. For example, when connecting to a Cu (Copper) based interconnect, the barrier layer may prevent a reaction of Cu to the nonstoichiometric oxide material in the OEL 406 and/or oxide layer 408. In another example, for connection to a pedestal material such as W (Tungsten) and/or Co (Cobalt), the barrier layer may not be included. The barrier layers 404, 410 may contain one or more materials. The barrier layer materials may include, but are not limited to, TiN, TaN, WN (tungsten nitride) and/or other transition metal compounds.

The oxide layer 408 may include one or more transition metal oxide materials, i.e., a nonstoichiometric oxide material. The transition metal oxide materials may include, but are not limited to, HfOx (hafnium oxide), HfTaOx (hafnium tantalum oxide), HfAlOx (hafnium aluminum oxide) and/or one or more other transition metal oxide materials. The OEL 406 may include one or more oxide materials. The oxide materials may include, but are not limited to, HfOx (hafnium oxide), TaOx (tantalum oxide) and/or alloys and/or combinations thereof.

In operation, the resistance of the resistive memory element 400 is related to the state (i.e., HRS or LRS) of the oxide layer 408. The resistance of the oxide layer 408 may be switched between the LRS and the HRS by application of opposite polarity voltages, as described herein. Physically, the resistive switching may be related to formation and rupture of filamentary conduction paths formed in the oxide layer 408 by movement of oxygen vacancies. Formation of filamentary conduction paths may then correspond to the LRS and rupture may then correspond to the HRS. Oxygen vacancies may be formed by a chemical reaction between the oxide layer 408 and the OEL 406. An electric field related to the applied voltage across the resistive memory element 400 may then cause movement of the oxygen vacancies.

A polarity of the resistive memory element 400 is related to a location of the OEL 406 in the resistive memory element 400. A first contact 420 corresponds to a positive electrode and the second contact 422 corresponds to a negative electrode. Thus, a positive voltage applied across the resistive memory element 400 greater than a corresponding threshold voltage may set the resistive memory element 400, i.e., transition the resistive memory element 400 to the LRS. Similarly, a negative voltage applied across the resistive memory element 400 with a magnitude greater than the magnitude of a corresponding threshold voltage may reset the resistive memory element 400, i.e., transition the resistive memory element 400 to the HRS. The polarity of the applied voltage is with respect to the polarity of the resistive memory element 400.

The following discussion may be best understood considering FIG. 3 in combination with FIG. 4. In a store operation, a resulting state of each resistive memory element, e.g., resistive memory element 400, is related to the orientation of the respective resistive memory element in the layer structure 300 of FIG. 3. As used herein, orientation corresponds to whether the positive electrode 420 of the resistive memory element 400 is coupled to a bit line or to a selector transistor. As used herein, a Type 1 configuration corresponds to the positive electrode 420 of the resistive memory element 400 coupled to a selector transistor. As used herein, a Type 2 configuration corresponds to the positive electrode 420 of the resistive memory element 400 coupled to a bit line. In the Type 1 configuration, the negative electrode 422 of the resistive memory element 400 is coupled to a bit line and in the Type 2 configuration, the negative electrode 422 of the resistive memory element 400 is coupled to the selector transistor.

The orientation of the resistive memory element 400 in the layer structure of the monolithic integrated circuit, e.g., layer structure 300, affects a relationship between the layers of the resistive memory element 400 and the layers of the monolithic integrated circuit 300. For example, for a Type 1 configuration, the positive electrode 420 may correspond to a bottom electrode for the resistive memory element 400. The positive electrode 420 may then be adjacent layer M1, e.g., the landing pedestal 320. The negative electrode 422 may then correspond to a top electrode that may then be connected to the bit line 330 by via 328 included in layer V2. Continuing with this example, layers 402, 404 and 406 may be included in layer V1, e.g., resistive memory element portion 332, and layers 408, 410 and 412 may be included in layer M2, e.g., resistive memory element portion 334.

In another example, for a Type 2 configuration, the positive electrode 420 may correspond to a top electrode for the resistive memory element 400. The positive electrode 420 may then be connected to the bit line 330 by via 328 included in layer V2. The negative electrode 422 may then correspond to a bottom electrode and may be adjacent layer M1, e.g., landing pedestal 320. Continuing with this example, layers 402, 404 and 406 may be included in layer M2, e.g., resistive memory element portion 334 of FIG. 3, and layers 408, 410 and 412 may then be included in layer V1, e.g., resistive memory element portion 332.

Figure 5:
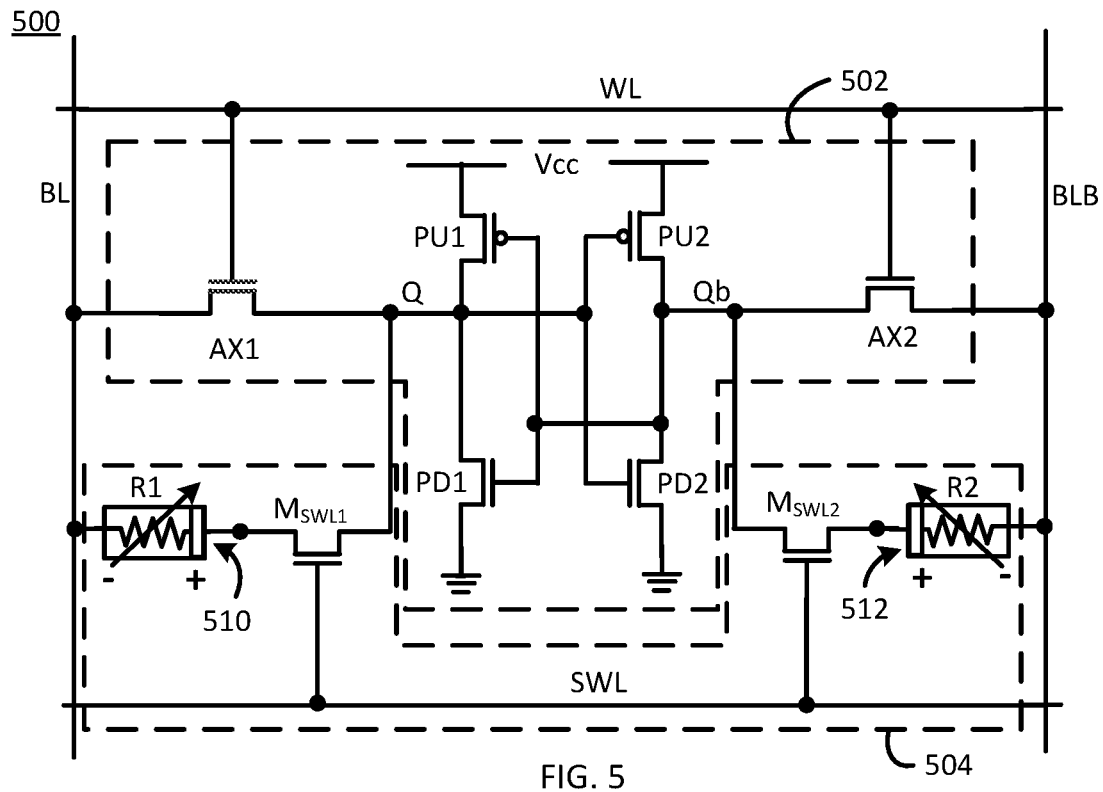
FIG. 5 illustrates a circuit diagram of one example Type 1 nonvolatile SRAM memory cell consistent with one embodiment of the present disclosure.

FIG. 5 illustrates a circuit diagram of one example Type 1 nonvolatile SRAM memory cell 500 consistent with one embodiment of the present disclosure. Nonvolatile SRAM memory cell 500 includes a volatile SRAM memory cell 502 and a pair 504 of nonvolatile RRAM memory cells. The volatile SRAM memory cell 502 corresponds to the volatile SRAM memory cell 102 of FIG. 1. The volatile SRAM memory cell 502 is a six transistor (6T) configuration that includes two access transistors AX1, AX2, two PMOS pull up transistors PU1, PU2 and two NMOS pull down transistors PD1, PD2. The pull up transistors PU1, PU2 are coupled to a supply voltage, Vcc, and the pull down transistors PD1, PD2 are coupled to ground. The first pull up transistor PU1 is coupled to the first pull down transistor PD1 to form a first inverter and the second pull up transistor PU2 is coupled to the second pull down transistor PD2 to form a second inverter. Thus, transistors PU1 and PD1 and PU2 and PD2 are examples of cross coupled inverters Inv1 and Inv2 of FIG. 1. An output of the first inverter is first data node Q and an output of the second inverter is second data node Qb.

The pair 504 of nonvolatile RRAM memory cells includes a first resistive memory element R1 coupled to a first selector transistor MSWL1 and a second resistive memory element R2 coupled to a second selector transistor MSWL2. The first resistive memory element R1 is coupled between a first bit line BL and the first selector transistor MSWL1. The second resistive memory element R2 is coupled between a second bit line BLB and the second selector transistor MSWL2. The first selector transistor MSWL1 is coupled to the first data node Q and the second selector transistor MSWL2 is coupled to a second data node Qb. A positive electrode 510 of the first resistive memory element R1 is coupled to a source electrode of the first selector transistor MSWL1 and a positive electrode 512 of the second resistive memory element R2 is coupled to a drain electrode of the second selector transistor MSWL2 (i.e., a Type 1 configuration). A respective gate electrode of each selector transistor MSWL1, MSWL2 is coupled to a selector word line SWL.

During normal operation, the selector transistors MSWL1, MSWL2 are off and the resistive memory elements R1, R2 are decoupled from respective data nodes Q, Qb. The volatile SRAM memory cell 502 may then be accessed for read and write operations via word line WL, bit lines BL, BLB and access transistors AX1, AX2. For operations associated with entering a low power state, the resistive memory elements R1, R2 may be coupled to respective data nodes Q, Qb and data stored by the volatile SRAM memory cell 502 may be stored to the pair 504 of nonvolatile RRAM memory cells prior to the volatile SRAM memory cell 502 entering the low power state. The stored data may be restored to the nonvolatile SRAM memory cell 502 from the pair 504 of nonvolatile RRAM memory cells when exiting the low power state. For example, power management logic may be configured to control one or more switches to couple or decouple the bit lines BL, BLB and/or selector word line SWL to/from one or more power supplies, as described herein.

Operations associated with storing the data contained in the volatile SRAM memory cell 502 to the pair 504 of nonvolatile RRAM memory cells include two parts with each part configured to store data to a respective resistive memory element R1 or R2. Initially, the first and second bit lines BL, BLB may be coupled to a bit line low voltage, VBLL, e.g., zero volts. The selector word line SWL may be coupled to a SWL positive voltage, VSWLH, and the selector transistors MSWL1, MSWL2 may be turned on. Thus, the positive electrode 510 of the first resistive memory element R1 may be coupled to data node Q and the positive electrode 512 of the second resistive memory element R2 may be coupled to the second data node Qb. If the volatile SRAM memory cell 502 stores a logic one (i.e., Q=Vcc, Qb=0), a voltage across the first resistive memory element R1 is positive with respect to the polarity of the first resistive memory element R1 and, assuming that Vcc is greater than the magnitudes of the threshold voltages (i.e., greater than Vset and greater than |Vreset|) of the resistive memory elements R1, R2, then the first resistive memory element R1 may be set, i.e., may transition to the LRS. A voltage across the second resistive memory element R2 is at or near zero, thus, a state of the second resistive memory element R2 is unchanged and may not be known. If the volatile SRAM memory cell 502 stores a logic zero (i.e., Qb=Vcc, Q=0), a voltage across the second resistive memory element R2 is positive with respect to the polarity of the second resistive memory element R2, R2 may be set and the state of R1 may be unchanged and unknown.

The selector word line SWL may then be decoupled from the SWL positive voltage, VSWLH, and the selector transistors MSWL1, MSWL2 may turn off. The first and second bit lines BL, BLB may be set to high, i.e., coupled to a bit line positive supply voltage, VBLH. The selector word line SWL may again be coupled to VSWLH, turning on the selector transistors MSWL1, MSWL2. The positive electrode 510 of the first resistive memory element R1 is again coupled to data node Q and the positive electrode 512 of the second resistive memory element R2 is again coupled to the second data node Qb. If the volatile SRAM memory cell 502 stores a logic one, a voltage across the second resistive memory element R2 is negative with respect to the polarity of the second resistive memory element R2 and, assuming that VBLH is greater than the threshold voltages of the resistive memory elements R1, R2, then the second resistive memory element R2 may be reset, i.e., may transition to the HRS. A voltage across the first resistive memory element R1 is at or near zero (assuming that VBLH=Vcc), thus, a state of the first resistive memory element R1 is unchanged and is set. If the volatile SRAM memory cell 502 stores a logic zero, R1 may be reset and the state of R2 may be unchanged, i.e., may be set. The selector word line SWL may then be decoupled from the positive supply voltage VSWLH and the selector transistors MSWL1, MSWL2 may turn off.

Thus, when the volatile SRAM memory cell 502 stores a logic 1 and for a Type 1 configuration, the first resistive memory element R1 may be set (i.e., LRS) and the second resistive memory element R2 may be reset (i.e., HRS). Similarly, when the volatile SRAM memory cell 502 stores a logic 0, the first resistive memory element R1 may be reset (i.e., HRS) and the second resistive memory element R2 may be set (i.e., LRS). Power may then be removed from the nonvolatile SRAM memory cell 500. The volatile SRAM memory cell 502 may no longer store data but the data may be retained by the pair 504 of nonvolatile RRAM memory cells.

When the system, e.g., a processing unit, exits the low power state (i.e., "wakes up"), the states of R1 and R2 may be utilized to restore the state of the volatile SRAM memory cell 502. The word line WL voltage may be and may remain at 0 V during restore operations, i.e., the access transistors AX1, AX2 may be off. Based on store operations, as described herein, if volatile SRAM memory element 502 stored a logic one, the first resistive memory element R1 may be set (LRS) and the second resistive memory element R2 may be reset (HRS) and if a 0 was stored, the first resistive memory element R1 may be reset and the second resistive memory element R2 may be set.

Initially, the first and second bit lines BL, BLB may be charged to a bit line high voltage VBLH. VBLH may correspond to Vcc, but may be supplied from a separate power rail. For example, during "wake-up", BL/BLB may be charged from a power rail from separate the SRAM cell power rail Vcc. The selector word line SWL may be coupled to a positive supply voltage VSWLH and the selector transistors MSWL1, MSWL2 may turn on, coupling the first resistive memory element R1 to the first data node Q and coupling the second resistive memory element R2 to the second data node Qb. A supply voltage, Vcc, to pull up transistors PU1, PU2 may be enabled. Since the bit lines BL, BLB are charged to a same voltage, VBLH, if the volatile SRAM memory cell 502 stored a logic one prior to entering the low power state (i.e., R1 in the LRS and R2 in the HRS), then a voltage drop across R1 is less than a corresponding voltage drop across R2 and a potential between the first data node Q and ground is greater than a corresponding potential between the second data node Qb and ground. Thus, the second pulldown transistor PD2 may turn on, driving the second data node Qb to zero (i.e., low) and the first pull-up transistor PU1 may turn on, driving the first data node Q high. Similarly, if the volatile SRAM memory cell 502 stored a zero prior to entering the low power state (i.e., R1 in the HRS and R2 in the LRS), then a voltage drop across R1 is greater than a corresponding voltage drop across R2 and a potential between the first data node Q and ground is less than a corresponding potential between the second data node Qb and ground. Thus, the first pulldown transistor PD1 may turn on, driving the first data node Q to zero and the second pull-up transistor PU2 may turn on, driving the second data node Qb high. Thus, the state of the volatile SRAM memory cell 502 may be restored.

Figure 6:
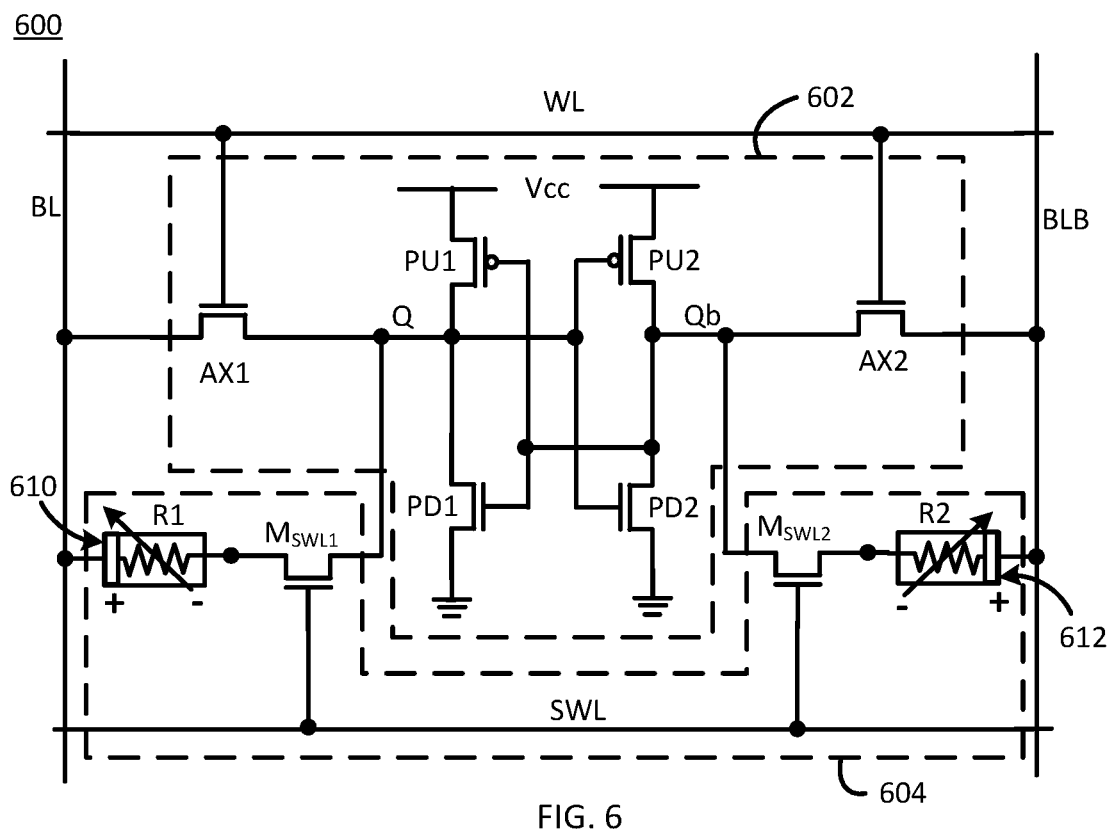
FIG. 6 illustrates a circuit diagram of one example Type 2 nonvolatile SRAM memory cell consistent with one embodiment of the present disclosure.

FIG. 6 illustrates a circuit diagram of one example Type 2 nonvolatile SRAM memory cell 600 consistent with one embodiment of the present disclosure. Nonvolatile SRAM memory cell 600 includes a volatile SRAM memory cell 602 and a pair 604 of nonvolatile RRAM memory cells. The volatile SRAM memory cell 602 corresponds to the volatile SRAM memory cell 102 of FIG. 1. For nonvolatile SRAM memory cells 500 and 600, like reference designators correspond to like elements. Thus, volatile SRAM memory element 602 is similar to volatile SRAM memory element 502 and the pair 604 of RRAM memory cells is similar to the pair 504 of RRAM memory cells except for the orientation of the resistive memory elements R1, R2. A positive electrode 610 of the first resistive memory element R1 is coupled to the first bit line BL and a positive electrode 612 of the second resistive memory element R2 is coupled to the second bit line BLB, thus a Type 2 configuration.

Normal, i.e., active, and store operations for nonvolatile SRAM memory cell 600 are the same as corresponding operations for nonvolatile SRAM memory cell 500. However, because of the different orientation of the resistive memory elements, R1, R2, storing volatile SRAM memory cell data to the pair of nonvolatile RRAM memory cells results in different states of the resistive memory elements R1, R2. Restore operations are similar except that the bit lines BL, BLB are coupled to a low bit line supply voltage VBLL, e.g., ground, rather than to VBLH.

Thus, for nonvolatile RRAM memory cell 600, when the volatile SRAM memory cell 602 stores a logic 1, the first resistive memory element R1 may be reset (i.e., HRS) and the second resistive memory element R2 may be set (i.e., LRS). Similarly, when the volatile SRAM memory cell 602 stores a logic 0, the first resistive memory element R1 may be set and the second resistive memory element R2 may be reset. Power may then be removed from the nonvolatile SRAM memory cell 600. The volatile SRAM memory cell 602 may no longer store data but the data may be retained by the pair 604 of nonvolatile RRAM memory cells. When the system, e.g., a processing unit, exits the low power state, the states of R1 and R2 may be utilized to restore the state of the volatile SRAM memory cell 602.

Initially, the first and second bit lines BL, BLB may be coupled to the bit line low-voltage, VBLL, i.e., may be coupled to ground. The selector word line SWL may be coupled to VSWLH, and the selector transistors MSWL1, MSWL2 may turn on, coupling the first resistive memory element R1 to the first data node Q and coupling the second resistive memory element R2 to the second data node Qb. A supply voltage Vcc to pull up transistors PU1, PU2 may be enabled. Since the bit lines BL, BLB are low, the gate electrodes of the pull up transistors PU1, PU2 and pull down transistors PD1, PD2 are coupled to VBLL, e.g., ground, through the respective resistive memory elements R1, R2. When the supply voltage Vcc is enabled, the pull up transistors PU1, PU2 are active. If a 1 was stored (R1 in the HRS and R2 in the LRS), then a current through R1 is less than a corresponding current through R2 and a potential between the first data node Q and ground is greater than a corresponding potential between the second data node Qb and ground. Thus, the second pulldown transistor PD2 may turn on, driving the second data node Qb to zero (i.e., low) and the first pull-up transistor PU1 may turn on, driving the first data node Q high. Similarly, if a zero was stored (R1 in the LRS and R2 in the HRS), then a current through R1 is greater than a corresponding current through R2 and a potential between the first data node Q and ground is less than a corresponding potential between the second data node Qb and ground. Thus, the first pulldown transistor PD1 may turn on, driving the first data node Q to zero and the second pull-up transistor PU2 may turn on, driving the second data node Qb high. Thus, the state of the volatile SRAM memory cell 602 may be restored.

It may be appreciated that although the store operations are equivalent, the resulting states of the resistive memory elements R1, R2 when SRAM data is stored to the corresponding pair of nonvolatile RRAM memory cells is related to the type configuration. For example, when the SRAM memory cell stores a logic 1, for a Type 1 configuration, e.g., nonvolatile SRAM memory cell 500, the first resistive memory element R1 may be set (i.e., LRS) and the second resistive memory element R2 may be reset (i.e., HRS) and for a Type 2 configuration, the first resistive memory element R1 may be reset (i.e., HRS) and the second resistive memory element R2 may be set (i.e., LRS). In another example, when the SRAM memory cell stores a logic 0, for a Type 1 configuration, the first resistive memory element R1 may be reset (i.e., HRS) and the second resistive memory element R2 may be set (i.e., LRS) and for a Type 2 configuration, the first resistive memory element R1 may be set and the second resistive memory element R2 may be reset. Restore operations for the two types of configurations differ with respect to the applied bit line voltage VBL.

Thus, the transistors PU1, PU2, PD1, PD2, AX1, AX2, included in volatile SRAM memory cells 502, 602, and transistors MSWL1, MSWL2, included in the pairs 504, 604 of nonvolatile RRAM memory cells may be fabricated in an FEOL (front end of line) process. For example, the transistors may be included in layers F1, C1 and C2 of FIG. 3. The metal traces corresponding to Vcc, WL and SWL may be routed in layer M0 of structure 300. The resistive memory elements R1, R2 may be fabricated in BEOL (back end of line) processes. For example, resistive memory elements R1, R2 may be contained in layers V1 and M2 (with a corresponding landing pedestal contained in layer M1) of structure 300. The metal traces of BL/BLB, that may be connected to the resistive memory elements R1, R2, may be routed in layer M3 of structure 300. Thus, on-chip nonvolatile storage may be provided and through vias may be avoided, as described herein.

Both Type 1 and Type 2 nonvolatile SRAM memory cells, e.g., nonvolatile SRAM memory cell 500 and nonvolatile SRAM memory cell 600, may be affected by source degeneration when the bit line voltage is VBLL, i.e., ground. Source degeneration is related to an amount of resistance coupled to a source electrode of a transistor, e.g., selector transistors MSWL1, MSWL2. An effect of source degeneration is to reduce the gate source voltage, Vgs, of the corresponding transistor. A reduced gate source voltage may cause transistors MSWL1 and/or MSWL2 to operate in a linear region and thus limit an amount of current through resistive memory elements R1 and/or R2. Since the state (i.e., set or reset) of each resistive memory element corresponds to the resistance (i.e., LRS, HRS), the state may be determined by sensing voltage and/or current across/through the resistive memory element. A reduced Vgs may thus interfere with accurate detection of the state of the resistive memory elements R1, R2. Source degeneration may be accommodated, i.e., compensated, by increasing VSWLH when the bit line voltage, VBL, is low, e.g., VBLL. For example, for a nominal VSWLH of 1 V, a compensated VSWLH may be increased to 1.4 V.

Output node Q, Qb voltages of Type 1 and Type 2 nonvolatile SRAM memory cells, e.g., nonvolatile SRAM memory cells 500, 600, may be affected (e.g., disturb) by current flow through the resistive memory elements R1, R2 when the bit line voltage is VBLL, i.e., ground. Such disturb may reduce Vgs, with a similar result as source degeneration, as described herein. The disturb may be mitigated by increasing supply voltage Vcc during store operations when the bit line voltage is VBLL. For example, for a nominal Vcc of 1 V, Vcc may be increased to 1.2 V. Thus, increasing VSWLH above a nominal value may be configured to mitigate both disturb and source degeneration.

Figure 7:
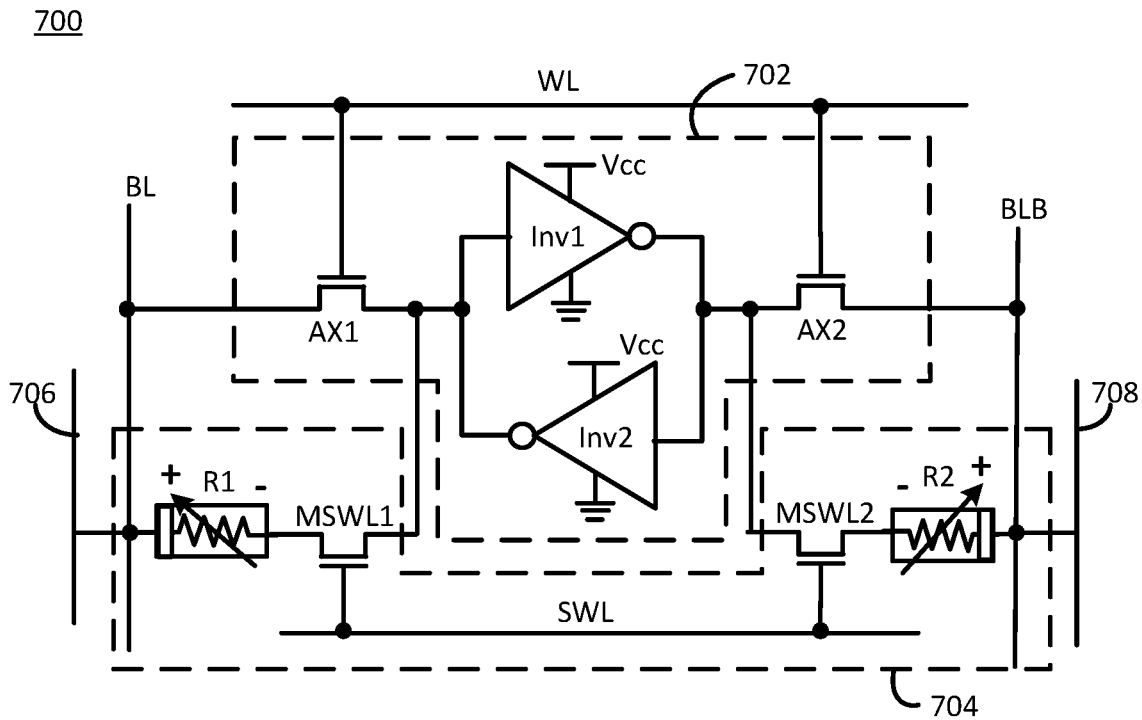
FIG. 7 illustrates a circuit diagram of one example nonvolatile SRAM memory cell including common mode voltage compensation for array-level column and/or row restore, consistent with one embodiment of the present disclosure.

FIG. 7 illustrates a circuit diagram of one example nonvolatile SRAM memory cell 700 including common mode voltage compensation for array-level column and/or row restore, consistent with one embodiment of the present disclosure. Nonvolatile SRAM memory cell 700 includes a volatile SRAM memory cell 702 and a pair 704 of nonvolatile RRAM memory cells. Example nonvolatile SRAM memory cell 700 further includes a pair of balanced common mode voltage lines 706, 708 configured to couple the pair 704 of nonvolatile RRAM memory cells to a common mode voltage reference, Vcm. The common mode voltage reference is configured to provide a reference voltage to the pair 704 of nonvolatile RRAM memory cells during restore operations, as described herein.

A plurality of nonvolatile SRAM memory cells may be restored in a same restore operation. For example, the plurality may include one row of nonvolatile SRAM memory cells in an array of memory cells. In another example, the plurality may include one column of nonvolatile SRAM memory cells. Restoring a plurality of nonvolatile SRAM memory cells in parallel is configured to reduce a duration of a time interval between initiation of a return from a low power state and restoring stored data to the associated volatile SRAM memory cells.

A plurality of nonvolatile SRAM memory cells, e.g., nonvolatile SRAM memory cell 100, 500, 600 and/or 700, may be included in a memory array, e.g., a level 2 (L2) cache. The memory array may be arranged as rows and columns. For example, a row of nonvolatile SRAM memory cells may share a word line WL and a selector word line SWL and a column of nonvolatile SRAM memory cells may share a first bit line BL and a second bit line BLB. The word line WL, selector word line SWL, first bit line BL and second bit line BLB may be fabricated as conductive (e.g., metal) traces included in a monolithic integrated circuit, as described herein. The conductive traces have nonideal properties including a nonzero resistance and a finite capacitance related to length. Power may be applied to each conductive trace at an end and, because of the nonideal properties, a magnitude of a corresponding voltage applied to a selected nonvolatile SRAM memory cell may depend on a distance between the selected nonvolatile SRAM memory cell and the end of the conductive trace, i.e., location of the power source.

The magnitude of the corresponding voltage applied to the selected nonvolatile SRAM memory cell may further depend on a number of nonvolatile SRAM memory cells between the selected nonvolatile SRAM memory cell and the location of the power source that are also being restored. In other words, there may be a voltage drop, i.e., IR drop, associated with each resistive memory element, e.g., R1, R2, included in the nonvolatile SRAM memory cells being restored in parallel with the selected nonvolatile SRAM memory cell. Thus, a voltage applied to each resistive memory element R1, R2, may vary with distance of the associated nonvolatile SRAM memory cell from the power source when a plurality of nonvolatile SRAM memory cells are being restored.

In an embodiment, a common mode reference voltage, Vcm, may be coupled to each pair of balanced common mode voltage lines, e.g., common mode voltage lines 706, 708, and thus, to resistive memory elements R1, R2 of a column of nonvolatile SRAM memory cells during a restore operation. Each pair of the plurality of pairs of balanced common mode voltage lines, e.g., common mode voltage lines 706, 708, may be positioned between the common mode voltage reference, Vcm, and a respective nonvolatile SRAM memory cell, e.g., nonvolatile SRAM memory cell 700. The common mode voltage lines 706, 708 are configured to be balanced to facilitate providing a same common mode voltage reference to each pair, e.g., pair 704, of nonvolatile RRAM memory cells. The common mode voltage lines 706, 708 are configured to couple the resistive memory elements R1, R2 to the common mode reference voltage, Vcm, and to provide the common mode reference voltage to each pair of resistive memory elements R1, R2 across a plurality of nonvolatile SRAM memory cells. The resistive memory elements of nonvolatile SRAM cells connected to the common mode voltage reference by the balanced common mode voltage lines may then be restored simultaneously in a same (e.g., one) restore operation.

Figure 8:
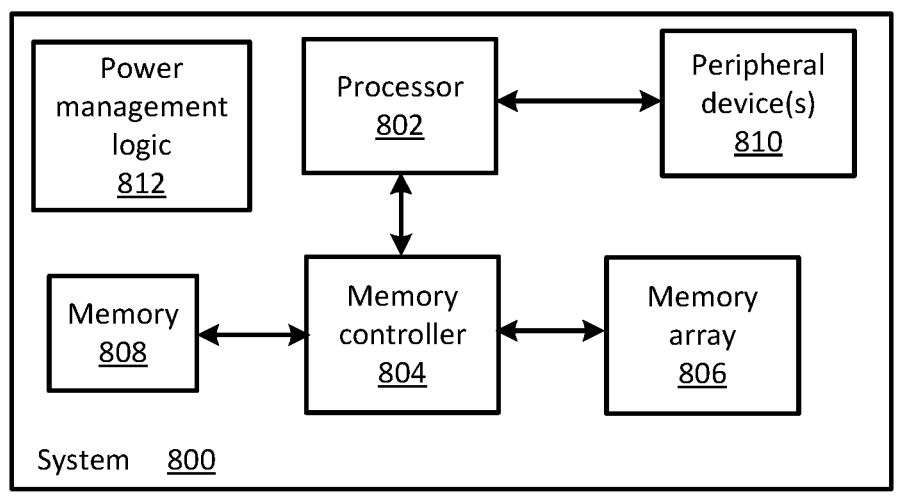
FIG. 8 illustrates a functional block diagram of a system consistent with several embodiments of the present disclosure.

FIG. 8 illustrates a functional block diagram of a system 800 including a memory array consistent with several embodiments of the present disclosure. System 800 includes a processor 802, a memory controller 804, an on-chip memory array 806 and power management logic 812. The system 800 may further include off-chip memory 808 and/or one or more peripheral devices 810. System 800 may include, but is not limited to, a mobile telephone including, but not limited to a smart phone (e.g., iPhone®, Android®-based phone, Blackberry®, Symbian®-based phone, Palm®-based phone, etc.); a wearable device (e.g., wearable computer, "smart" watches, smart glasses, smart clothing, etc.) and/or system; an Internet of Things (IoT) networked device including, but not limited to, a sensor system (e.g., environmental, position, motion, etc.) and/or a sensor network (wired and/or wireless); a computing system (e.g., a server, a workstation computer, a desktop computer, a laptop computer, a tablet computer (e.g., iPad®, GalaxyTab® and the like), an ultraportable computer, an ultramobile computer, a netbook computer and/or a subnotebook computer; etc.

Processor 802 is configured to perform operations associated with system 800. Processor 802 may include one or more processing unit(s), i.e., cores. Memory controller 804 is configured to couple processor 802 to on-chip memory array 806 and/or off-chip memory 808. Peripheral devices 810 may include a user interface (e.g., a key pad, keyboard, touch pad, mouse, display, touch sensitive display), one or more sensor(s) (e.g., an accelerometer, global positioning system (GPS), gyroscope, etc.), storage device(s) (e.g., hard disk drive, solid state drive, etc.), etc.

Memory array 806 may contain and/or correspond to a cache memory, e.g., an L2 cache. Memory array 806 may contain a plurality of nonvolatile SRAM memory cells, as described herein. For example, memory array 806 may contain a plurality of Type 1 nonvolatile SRAM memory cells, e.g., nonvolatile SRAM memory cell 500 of FIG. 5. In another example, memory array 806 may contain a plurality of Type 2 nonvolatile SRAM memory cells, e.g., nonvolatile SRAM memory cell 600 of FIG. 6. Memory controller 804 may be configured to provide control inputs to nonvolatile SRAM memory cells included in memory array 806 and to capture output signals. For example, memory controller 804 may be configured to select and/or unselect one or more nonvolatile SRAM memory cells and to set, reset and/or read selected nonvolatile SRAM memory cells.

Power management logic 812 is configured to manage transitioning system 800 from an active state to a low power, i.e., sleep, state and from the low power state to the active state. Power management logic 812 may provide control inputs (i.e., signals) to one or more nonvolatile SRAM memory cells that are configured to manage storing the volatile SRAM memory cell data (i.e., data contained in the volatile SRAM memory cell) to the pair of nonvolatile RRAM memory cells. For example, power management logic 812 may be configured to control coupling one or more voltages to a selector word line SWL, a first bit line BL and/or a second bit line BLB in order to store the volatile SRAM memory cell state to the resistive memory elements, as described herein. Power management logic 812 may be further configured to provide control inputs to the nonvolatile SRAM memory cells in order to restore the corresponding state of the volatile SRAM memory cell. For example, power management logic 812 may be configured to control coupling one or more voltages to the selector word line SWL, the bit lines BL, BLB, the common mode voltage lines and/or the voltage applied to the cross coupled inverters of the volatile SRAM memory cell. Thus, data stored to at least a portion of memory array 806, i.e., volatile memory, may be stored to local nonvolatile RRAM prior to system 800 entering a low power state and restored after exiting the low power state. Latencies associated with off chip storage (e.g., off chip memory 808) may thus be avoided.

Figure 9:
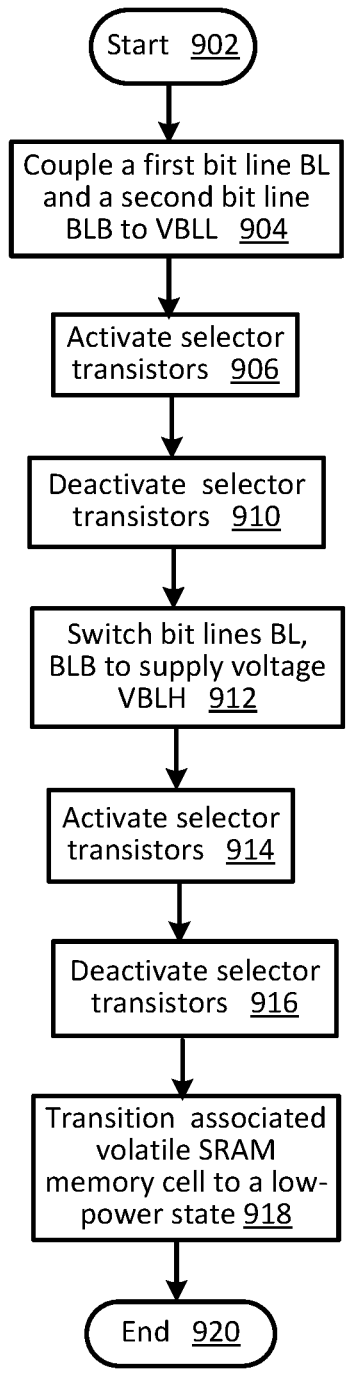
FIG. 9 is a flowchart of store operations according to various embodiments of the present disclosure.

FIG. 9 is a flowchart 900 of store operations according to various embodiments of the present disclosure. In particular, the flowchart 900 illustrates storing volatile SRAM data to a pair of nonvolatile RRAM memory cells. The operations may be performed, for example, by power management logic 812 of FIG. 8 on nonvolatile SRAM memory cells included in memory array 806. For example, the nonvolatile SRAM memory cells may correspond to one or more of nonvolatile memory cells 100, 500, 600 and/or 700.

Operations of this embodiment may begin with start 902. A first bit line BL and a second bit line BLB may be coupled to a bit line low voltage, VBLL, at operation 904. For example, VBLL may be 0 V, e.g., ground. Selector transistors may be activated, i.e., turned on, at operation 906. For example, a selector word line positive voltage, VSWLH, may be coupled to the control inputs, e.g., gate electrodes, of the selector transistors. The selector word line positive voltage may remain coupled to the control inputs and the selector transistors may be maintained active for a time interval. The selector transistors may be deactivated, i.e., turned off, at operation 910. For example, the voltage VSWLH may be decoupled from the control inputs of the selector transistors. The bit lines BL, BLB may be switched to a bit line positive supply voltage VBLH at operation 912. For example, the bit lines BL, BLB may be decoupled from a bit line low supply voltage VBLL and then coupled to VBLH. The selector transistors may be activated, i.e., turned on, at operation 914. The bit lines BL, BLB may be maintained at the bit line positive supply voltage VBLH for a time interval. The selector transistors may be deactivated at operation 916. For example, the voltage VSWLH may be decoupled from the control inputs of the selector transistors. An associated volatile SRAM memory cell may be transitioned to a low power, i.e., sleep, state at operation 918. For example, a power supply, e.g., Vcc, may be decoupled from the volatile SRAM memory cell and/or the power supply may be powered down. Program flow may then end at operation 920.

Thus, data, e.g., a state, of a volatile SRAM memory cell may be stored to a pair of nonvolatile RRAM memory cells and the SRAM memory cell may be transitioned to a low power state. Latencies associated with storing data to off-chip storage may thus be avoided.

Figure 10:
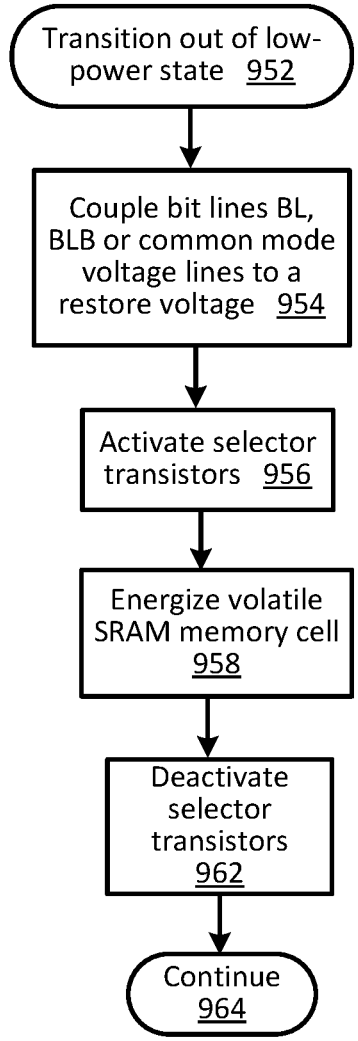
FIG. 10 is a flowchart of restore operations according to various embodiments of the present disclosure.

FIG. 10 is a flowchart 950 of restore operations according to various embodiments of the present disclosure. In particular, the flowchart 950 illustrates restoring volatile SRAM data from the pair of nonvolatile RRAM memory cells to the volatile SRAM memory cell. The operations may be performed, for example, by power management logic 812 of FIG. 8 on nonvolatile SRAM memory cells included in memory array 806. For example, the nonvolatile SRAM memory cells may correspond to one or more of nonvolatile memory cells 100, 500, 600 and/or 700.

Operations of this embodiment may begin with transitioning out of a low power state at operation 952. Bit lines BL and BLB or common mode voltage lines may be coupled to a restore voltage at operation 954. For example, for a nonvolatile SRAM memory cell that includes Type 1 RRAM memory cells, the restore voltage may be VBLH. In another example, for a nonvolatile SRAM memory cell that includes Type 2 RRAM memory cells, the restore voltage may be VBLL. In another example, the common mode voltages lines may correspond to balanced common mode voltage lines 706, 708 of FIG. 7. Selector transistors may be activated, i.e., turned on, at operation 956. For example, a voltage VSWLH may be coupled to the control inputs, e.g., gate electrodes, of the selector transistors. The volatile SRAM memory cell may be energized at operation 958. For example, a supply voltage Vcc may be coupled to the cross coupled inverters. The selector transistors may be maintained active for a time interval. During the time interval, the state of the volatile SRAM memory cell may be restored based, at least in part, on the respective resistances of the resistive memory elements R1, R2 included in the pair of RRAM memory cells. The selector transistors may be deactivated at operation 962. Program flow may then continue at operation 964.

Thus, data, e.g., a state, of a volatile SRAM memory cell may be restored from the pair of nonvolatile RRAM memory cells after the SRAM memory cell has transitioned out of a low power state. Latencies associated with retrieving data from off-chip storage may thus be avoided.

While the flowcharts of FIGS. 9 and 10 illustrate operations according various embodiments, it is to be understood that not all of the operations depicted in FIGS. 9 and 10 are necessary for other embodiments. In addition, it is fully contemplated herein that in other embodiments of the present disclosure, the operations depicted in FIGS. 9 and/or 10 and/or other operations described herein may be combined in a manner not specifically shown in any of the drawings, and such embodiments may include less or more operations than are illustrated in FIGS. 9 and 10. Thus, claims directed to features and/or operations that are not exactly shown in one drawing are deemed within the scope and content of the present disclosure FIGS. 11 through 13 are plots of simulation data for a Type 1 nonvolatile SRAM memory cell. FIGS. 14 through 16 are plots of simulation data for a Type 2 nonvolatile SRAM memory cell. FIGS. 11 and 14 correspond to a first part of a store operation and FIGS. 12 and 15 correspond to a second part of the store operation. FIGS. 13 and 16 correspond to a restore operation. The volatile SRAM memory cell is storing a logic 1 and a logic 1 is restored for both simulation examples. The horizontal axis is time in nanoseconds (ns) for all of the plots of FIGS. 11 through 16.

The simulation data was generated utilizing Cadence® Spectre® circuit simulator (available from Cadence, San Jose, Calif.). All transistors were modeled as 14 nm fin FETs with a minimum number of fins per transistor of two. The pull up transistors, PU1, PU2 were both 2-fin, 25 nm transistors and the pull down transistors, PD1, PD2, access transistors, AX1, AX2 and selector transistors, MSWL1, MSWL2 were all 6-fin, 25 nm transistors. The resistive memory elements R1, R2 were modeled as voltage controlled resistors implemented in Verilog-A with a HRS resistance of 40 kilo ohms (kΩ), an LRS resistance of 10 kΩ, a set voltage of 0.7 V and a reset voltage of −0.7 V.

For FIGS. 11 and 14, the first bit line BL and second bit line BLB are coupled to a supply voltage, VBLH, of 1 V, the supply voltage, Vcc, to the cross coupled inverters of the volatile SRAM memory cell is 1 V and the control voltage to turn on the selector transistors, VSWLH, is also 1 V. For FIGS. 12 and 15 the first bit line BL and second bit line BLB are coupled to VBLL, i.e., ground, the supply voltage, Vcc, to the cross coupled inverters of the volatile SRAM memory cell is 1.2 V and the control voltage to turn on the selector transistors, VSWLH, is 1.4 V. For FIG. 13, Vcc is 1 V, VSWLH is 1 V and the first bit line BL and second bit line BLB are coupled to a supply voltage, VBLH, of 1 V. For FIG. 16, Vcc is 1 V, VSWLH is 1 V and the first bit line BL and second bit line BLB are coupled to VBLL, i.e., ground.

FIG. 11 includes three plots. The first plot 1000 illustrates selector transistor control voltage VSWL. The second plot 1010 illustrates data node Q, Qb voltages, curves 1012, 1014, respectively, for the volatile SRAM memory cell. The third plot 1020 illustrates the resistance in kΩ of the resistive memory elements R1, R2, curves 1022 and 1024, respectively. As illustrated by the plots 1000, 1010, 1020, when VSWL switches from low, i.e., VSWLL, to high, i.e., VSWLH, the second resistive memory element R2 transitions from the LRS to the HRS and the first resistive memory element R1 remains unchanged.

FIG. 12 includes three plots. The first plot 1030 illustrates selector transistor control voltage VSWL. The second plot 1040 illustrates data node Q, Qb voltages, curves 1042, 1044, respectively, for the volatile SRAM memory cell. The third plot 1050 illustrates the resistance in kΩ of the resistive memory elements R1, R2, curves 1052 and 1054, respectively. As illustrated by the plots 1030, 1040, 1050, when VSWL switches from low to high, the first resistive memory element R1 transitions from the HRS to the LRS and the second resistive memory element R2 remains unchanged, i.e., remains in the HRS.

FIG. 13 includes three plots. The first plot 1060 illustrates selector transistor control voltage VSWL 1064 and the supply voltage Vcc 1062. The second plot 1070 illustrates data node Q, Qb voltages, curves 1072 and 1074, respectively, for the volatile SRAM memory cell. The third plot 1080 illustrates the resistance in kΩ of the resistive memory elements R1, R2. The resistance of the resistive memory elements R1, R2 curves 1082, 1084, respectively, remain unchanged in the LRS and the HRS, respectively.

Turning first to plot 1060, initially, at time zero, the corresponding volatile SRAM memory cell is active, i.e., the supply voltage Vcc is 1 V and the selector transistor control voltage VSWL is zero. At time equals 5 ns, the supply voltage Vcc begins to ramp down the zero, i.e., the volatile SRAM memory cell is transitioned to a low power state. At time equal to about 8 ns, the selector transistor control voltage VSWL begins to ramp up to 1 V. At time equal to 10 ns, the supply voltage Vcc begins to ramp up to 1 V. In other words at time equal to 10 ns, transitioning the volatile SRAM memory cell out of the low power state is initiated.

Turning now to the second plot 1070, at time equal to 5 ns, the data output node Q, 1072 of the volatile SRAM memory cell begins to decay from its set value of 1 V. At time equal to about 8 ns, the data output node, Q, voltage 1072 begins to increase and at time equal to 10 ns, the data output node, Q, voltage rapidly increases to its set value of 1 V. Thus, the stored state of the volatile SRAM memory cell is restored.

FIG. 14 includes three plots. The first plot 1100 illustrates selector transistor control voltage VSWL. The second plot 1110 illustrates data node Q, Qb voltages, curves 1112, 1114, respectively, for the volatile SRAM memory cell. The third plot 1120 illustrates the resistance in kΩ of the resistive memory elements R1, R2, curves 1122 and 1124, respectively. As illustrated by the plots 1100, 1110, 1120, when VSWL switches from low, i.e., VSWLL, to high, i.e., VSWLH, the second resistive memory element R2 transitions from the HRS to the LRS and the first resistive memory element R1 remains unchanged.

FIG. 15 includes three plots. The first plot 1130 illustrates selector transistor control voltage VSWL. The second plot 1140 illustrates data node Q, Qb voltages, curves 1142, 1144, respectively, for the volatile SRAM memory cell. The third plot 1150 illustrates the resistance in kΩ of the resistive memory elements R1, R2, curves 1152 and 1154, respectively. As illustrated by the plots 1130, 1140, 1150, when VSWL switches from low to high, the first resistive memory element R1 transitions from the LRS to the HRS and the second resistive memory element R2 remains unchanged, i.e., remains in the LRS.

FIG. 16 includes three plots. The first plot 1160 illustrates selector transistor control voltage VSWL 1164 and the supply voltage Vcc 1162. The second plot 1170 illustrates data node Q, Qb voltages, curves 1172, 1174, respectively, for the volatile SRAM memory cell. The third plot 1180 illustrates the resistance in kΩ of the resistive memory elements R1, R2, curves 1182, 1184, respectively. The resistance of the resistive memory elements R1, R2 remain unchanged in the HRS and the LRS, respectively.

Turning first to plot 1160, initially, at time zero, the corresponding volatile SRAM memory cell is active, i.e., the supply voltage Vcc is 1 V and the selector transistor control voltage VSWL is zero. At time equals 5 ns, the supply voltage Vcc begins to ramp down the zero, i.e., the volatile SRAM memory cell is transitioned to a low power state. At time equal to about 8 ns, the selector transistor control voltage VSWL begins to ramp up to 1 V. At time equal to 10 ns, the supply voltage Vcc begins to ramp up to 1 V. In other words at time equal to 10 ns, transition of the volatile SRAM memory cell out of the low power state is initiated.

Turning now to the second plot 1170, at time equal to 5 ns, the data output node Q 1172 of the volatile SRAM memory cell begins to decay from its set value of 1 V. At time equal to about 8 ns, the data output node, Q 1172, voltage drops to zero and at time equal to 10 ns, the data output node, Q, voltage rapidly increases to near its set value of 1 V. Thus, the stored state of the volatile SRAM memory cell is restored.

Generally, this disclosure relates to a non-volatile SRAM (static random access memory) memory cell. The nonvolatile SRAM memory cell includes a 6T volatile SRAM memory cell and a pair of 1T1R nonvolatile RRAM memory cells. The pair of nonvolatile RRAM memory cells is configured to provide on-chip nonvolatile storage to the volatile SRAM memory cell.

An apparatus, method and/or system are configured to provide on-chip nonvolatile storage for each volatile SRAM memory cell. During operation, power management logic may be configured to store data contained in a volatile SRAM memory cell to an associated pair of nonvolatile RRAM memory cells prior to entering a sleep, i.e. low power, state. The power management logic may be further configured to restore the stored data from the pair of nonvolatile RRAM memory cells to the volatile SRAM memory cell upon exiting the low power state. Thus, speed and endurance associated with volatile SRAM memory cells may be preserved during normal operation and on chip nonvolatile storage may be utilized to support corresponding low power states.

Thus, latencies associated with storing SRAM data to off-chip storage such as flash memory and/or a hard disk drive may be avoided. Through vias to couple the pair of nonvolatile RRAM memory cells to the volatile SRAM memory cells may be avoided, thus, facilitating (e.g., enabling) monolithic integration of the pair of nonvolatile RRAM memory cells and the volatile SRAM memory cell. Nonvolatile SRAM memory cells, consistent with the present disclosure, may thus be fabricated using advanced CMOS processes. A nonvolatile SRAM memory cell, consistent with the present disclosure, may be utilized to provide on-chip nonvolatile storage for, e.g., cache memory, processor registers and/or flip flops. Energy efficiency may be enhanced by facilitating utilization of low power states while maintaining data integrity.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hard-wired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

The foregoing provides example system architectures and methodologies, however, modifications to the present disclosure are possible. The processor may include one or more processor cores and may be configured to execute system software. System software may include, for example, an operating system. Device memory may include I/O memory buffers configured to store one or more data packets that are to be transmitted by, or received by, a network interface.

The operating system (OS) may be configured to manage system resources and control tasks that are run on, e.g., system 800. For example, the OS may be implemented using Microsoft® Windows®, HP-UX®, Linux®, or UNIX®, although other operating systems may be used. In another example, the OS may be implemented using Android™, iOS, Windows Phone® or BlackBerry®. In some embodiments, the OS may be replaced by a virtual machine monitor (or hypervisor) which may provide a layer of abstraction for underlying hardware to various operating systems (virtual machines) running on one or more processing units. The operating system and/or virtual machine may implement one or more protocol stacks. A protocol stack may execute one or more programs to process packets. An example of a protocol stack is a TCP/IP (Transport Control Protocol/Internet Protocol) protocol stack comprising one or more programs for handling (e.g., processing or generating) packets to transmit and/or receive over a network.

Memory 808 may include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may include other and/or later-developed types of computer-readable memory.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog—Unified Hardware Design, Specification, and Verification Language, dated Jul. 7, 2011; IEEE Std 1800™-2012: IEEE Standard for SystemVerilog-Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

EXAMPLES

Examples of the present disclosure include subject material such as a method, means for performing acts of the method, a device, or of an apparatus or system related to a non-volatile SRAM, as discussed below.

Example 1

According to this example, there is provided an apparatus. The apparatus includes a pair of nonvolatile resistive random access memory (RRAM) memory cells coupled to a volatile static RAM (SRAM) memory cell. The pair of nonvolatile RRAM memory cells includes a first RRAM memory cell and a second RRAM memory cell. The first RRAM memory cell includes a first resistive memory element coupled to a first bit line, and a first selector transistor coupled between the first resistive memory element and a first output node of the volatile SRAM memory cell. The second RRAM memory cell includes a second resistive memory element coupled to a second bit line, and a second selector transistor coupled between the second resistive memory element and a second output node of the volatile SRAM memory cell.

Example 2

This example includes the elements of example 1, wherein each resistive memory element includes a plurality of layers.

Example 3

This example includes the elements of example 1, wherein the first resistive memory element includes a first positive electrode and a first negative electrode and the second resistive memory element includes a second positive electrode and a second negative electrode

Example 4

This example includes the elements of example 3, wherein the first positive electrode is coupled to the first bit line and the second positive electrode is coupled to the second bit line.

Example 5

This example includes the elements of example 3, wherein the first positive electrode is coupled to the first selector transistor and the second positive electrode is coupled to the second selector transistor.

Example 6

This example includes the elements according to any one of examples 1 to 3, wherein each resistive memory element occupies a plurality of adjacent back end layers of a monolithic integrated circuit.

Example 7

This example includes the elements according to any one of examples 1 to 3, wherein a control input of each selector transistor is coupled to a selector word line.

Example 8

This example includes the elements of example 2, wherein the plurality of layers includes an oxygen exchange layer adjacent an oxide layer.

Example 9

This example includes the elements according to any one of examples 1 to 3, wherein the first RRAM memory cell and the second RRAM memory cell are formed using an advanced CMOS (complementary metal oxide semiconductor) process.

Example 10

This example includes the elements of example 9, wherein a minimum feature size is less than or equal to 20 nanometers (nm).

Example 11

This example includes the elements according to any one of examples 1 to 3, and further includes a pair of balanced common mode voltage lines to couple the resistive memory elements to a common mode reference voltage.

Example 12

According to this example, there is provided an integrated circuit. The integrated circuit includes a plurality of back end layers. At least one front end layer includes a first selector transistor and a second selector transistor. The selector transistors are coupled to a volatile static random access memory (SRAM) memory cell. The plurality of back end layers include a first metal layer, a first via layer adjacent the first metal layer, a second metal layer adjacent the first via layer, a first resistive memory element, and a second resistive memory element. The first resistive memory element is coupled between the first selector transistor and a first bit line, the second resistive memory element is coupled between the second selector transistor and a second bit line.

Example 13

This example includes the elements of example 12, wherein the first resistive memory element is contained in a plurality of adjacent back end layers and the second resistive memory element is contained in the plurality of adjacent back end layers.

Example 14

This example includes the elements of example 12, wherein the first resistive memory element is contained in the first via layer and the second metal layer and the second resistive memory element is contained in the first via layer and the second metal layer.

Example 15

This example includes the elements of example 14, wherein the first metal layer includes a first landing pedestal for the first resistive memory element and a second landing pedestal for the second resistive memory element.

Example 16

This example includes the elements according to any one of examples 12 to 14, wherein the volatile SRAM memory cell is contained in a CMOS (complementary metal oxide semiconductor) region and the selector transistors and resistive memory elements are contained in an RRAM (resistive random access memory) region adjacent the CMOS region.

Example 17

This example includes the elements according to any one of examples 12 to 14, wherein each resistive memory element includes a plurality of material layers.

Example 18

This example includes the elements of example 17, wherein the plurality of material layers includes an oxygen exchange layer and an oxide layer.

Example 19

This example includes the elements of example 18, wherein the oxygen exchange layer is contained in the second metal layer.

Example 20

This example includes the elements of example 18, wherein the oxygen exchange layer is contained in the first via layer.

Example 21

This example includes the elements of example 17, wherein the plurality of material layers includes a first work function matching layer, a first barrier layer adjacent the first work function matching layer, an oxygen exchange layer adjacent the first barrier layer, an oxide layer adjacent the oxygen exchange layer, a second barrier layer adjacent the oxide layer and a second work function matching layer adjacent the second barrier layer.

Example 22

This example includes the elements of example 17, wherein a first portion of the plurality of material layers is contained in the second metal layer and a second portion of the plurality of material layers is contained in the first via layer.

Example 23

This example includes the elements of example 12, wherein the selector transistors and the resistive memory elements are formed using an advanced CMOS (complementary metal oxide semiconductor) process.

Example 24

According to this example, there is provided a system. The system includes a processor including at least one core; a memory controller; and a memory array including a plurality of nonvolatile static random access memory (SRAM) memory cells. Each nonvolatile SRAM memory cell includes a pair of nonvolatile resistive random access memory (RRAM) memory cells coupled to a volatile SRAM memory cell. The pair of nonvolatile RRAM memory cells includes a first RRAM memory cell and a second RRAM memory cell. The first RRAM memory cell includes a first resistive memory element coupled to a first bit line, and a first selector transistor coupled between the first resistive memory element and a first output node of the volatile SRAM memory cell. The second RRAM memory cell includes a second resistive memory element coupled to a second bit line, and a second selector transistor coupled between the second resistive memory element and a second output node of the volatile SRAM memory cell.

Example 25

This example includes the elements of example 24, wherein each resistive memory element includes a plurality of material layers.

Example 26

This example includes the elements of example 24, wherein the first resistive memory element includes a first positive electrode and a first negative electrode and the second resistive memory element includes a second positive electrode and a second negative electrode Example 27

This example includes the elements of example 26, wherein the first positive electrode is coupled to the first bit line and the second positive electrode is coupled to the second bit line.

Example 28

This example includes the elements of example 26, wherein the first positive electrode is coupled to the first selector transistor and the second positive electrode is coupled to the second selector transistor.

Example 29

This example includes the elements according to any one of examples 24 to 26, wherein each resistive memory element occupies a plurality of adjacent back end layers of a monolithic integrated circuit.

Example 30

This example includes the elements according to any one of examples 24 to 26, wherein a control input of each selector transistor is coupled to a selector word line.

Example 31

This example includes the elements of example 25, wherein the plurality of material layers includes an oxygen exchange layer adjacent an oxide layer.

Example 32

This example includes the elements according to any one of examples 24 to 26, wherein the first RRAM memory cell and the second RRAM memory cell are formed using an advanced CMOS (complementary metal oxide semiconductor) process.

Example 33

This example includes the elements of example 32, wherein a minimum feature size is less than or equal to 20 nanometers (nm).

Example 34

This example includes the elements according to any one of examples 24 to 26, and further includes a pair of balanced common mode voltage lines to couple the resistive memory elements to a common mode reference voltage.

Example 35

This example includes the elements according to any one of examples 24 to 26, wherein the memory array is cache memory.

Example 36

This example includes the elements according to any one of examples 24 to 26, wherein each nonvolatile SRAM memory cell is a Type 1 configuration.

Example 37

This example includes the elements according to any one of examples 24 to 26, wherein each nonvolatile SRAM memory cell is a Type 2 configuration.

Example 38

This example includes the elements according to any one of examples 24 to 26, and further includes power management logic.

Example 39

This example includes the elements of example 38, wherein the power management logic is to store data contained in the volatile SRAM memory cell to the pair of nonvolatile RRAM memory cells and to transition the volatile SRAM memory cell to a low power state.

Example 40

This example includes the elements of example 39, wherein the power management logic is further to transition the volatile SRAM memory cell out of the low power state and to restore the data to the volatile SRAM memory cell.

Example 41

This example includes the elements of example 39, wherein the storing includes coupling the first bit line and the second bit line to a bit line low voltage, activating the selector transistors, maintaining the selector transistors active for a time interval, deactivating the selector transistors, switching the bit lines to a bit line positive supply voltage, activating the selector transistors, maintaining the selector transistors active for a time interval and deactivating the selector transistors.

Example 42

This example includes the elements of example 40, wherein the restoring includes coupling the first bit line and the second bit line to a restore voltage, activating the selector transistors, energizing the volatile SRAM memory cell and deactivating the selector transistors.

Example 43

This example includes the elements of example 42, wherein the restore voltage is a positive voltage.

Example 44

This example includes the elements of example 42, wherein the restore voltage is zero volts.

Example 45

According to this example, there is provided a method. The method includes storing, by power management logic, data contained in a volatile SRAM (static random access memory) memory cell to a pair of nonvolatile RRAM memory cells; and transitioning, by the power management logic, the volatile SRAM memory cell to a low power state. The pair of nonvolatile RRAM memory cells is coupled to the volatile SRAM memory cell. The pair of nonvolatile RRAM memory cells includes a first RRAM memory cell and a second RRAM memory cell. The first RRAM memory cell includes a first resistive memory element coupled to a first bit line, and a first selector transistor coupled between the first resistive memory element and a first output node of the volatile SRAM memory cell. The second RRAM memory cell includes a second resistive memory element coupled to a second bit line, and a second selector transistor coupled between the second resistive memory element and a second output node of the volatile SRAM memory cell.

Example 46

This example includes the elements of example 45, and further includes transitioning, by the power management logic, the volatile SRAM memory cell out of the low power state; and restoring, by the power management logic, the data to the volatile SRAM memory cell.

Example 47

This example includes the elements of example 45, wherein the storing further includes coupling the first bit line and the second bit line to a bit line low voltage, activating the selector transistors, maintaining the selector transistors active for a time interval, deactivating the selector transistors, switching the bit lines to a bit line positive supply voltage, activating the selector transistors, maintaining the selector transistors active for a time interval and deactivating the selector transistors.

Example 48

This example includes the elements of example 46, wherein the restoring includes coupling the first bit line and the second bit line or a pair of balanced common mode voltage lines to a restore voltage, activating the selector transistors, energizing the volatile SRAM memory cell and deactivating the selector transistors.

Example 49

This example includes the elements of example 48, wherein the restore voltage is a positive voltage

Example 50

This example includes the elements of example 48, wherein the restore voltage is zero volts.

Example 51

According to this example, there is provided a system. The system includes at least one device arranged to perform the method of any one of examples 45 to 50.

Example 52

According to this example, there is provided a device. The device includes means to perform the method of any one of examples 45 to 50.

Example 53

According to this example, there is provided a computer readable storage device having stored thereon instructions that when executed by one or more processors result in the following operations including the method according to any one of examples 45 through 50.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
  a volatile static memory cell that includes:
    cross coupled inverters;
    a first access transistor having a source coupled to the cross coupled inverter; and
    a second access transistor having a drain coupled to the cross coupled inverter; and
  a pair of nonvolatile resistive random access memory (RRAM) memory cells coupled to a volatile static RAM (SRAM) memory cell, the pair of nonvolatile RRAM memory cells comprising a first RRAM memory cell and a second RRAM memory cell,
  the first RRAM memory cell comprising:
    a first resistive memory element coupled to a first bit line, and
    a first selector transistor coupled between the first resistive memory element and a first output node of the volatile SRAM memory cell;
    the first selector transistor including:
      a drain communicatively coupled to the source of the first access transistor; and
      a gate communicatively coupled to a selector word line, the selector word line to cause a transfer of logic state from the first output node of the volatile SRAM memory cell to the first RRAM memory cell prior to entry into a low power state; and the second RRAM memory cell comprising:
- a second resistive memory element coupled to a second bit line, and
- a second selector transistor coupled between the second resistive memory element and a second output node of the volatile SRAM memory cell;
  - the second selector transistor including:
    - a drain communicatively coupled to the drain of the second access transistor; and
    - a gate communicatively coupled to the selector word line, the selector word line to cause a transfer of logic state from the second output node of the volatile SRAM memory cell to the second RRAM memory cell prior to entry into the low power state.

2. The apparatus of claim 1, wherein the first resistive memory element comprises a first positive electrode and a first negative electrode and the second resistive memory element comprises a second positive electrode and a second negative electrode.

3. The apparatus of claim 2, wherein the first positive electrode is coupled to the first bit line and the second positive electrode is coupled to the second bit line.

4. The apparatus of claim 2, wherein the first positive electrode is coupled to the first selector transistor and the second positive electrode is coupled to the second selector transistor.

5. The apparatus of claim 1, wherein the first RRAM memory cell and the second RRAM memory cell are formed using an advanced CMOS (complementary metal oxide semiconductor) process.

6. The apparatus of claim 5, wherein a minimum feature size is less than or equal to 20 nanometers (nm).

7. A system comprising:
- a processor comprising at least one core;
- a memory controller; and
- a memory array comprising a plurality of nonvolatile static random access memory (SRAM) memory cells, each nonvolatile SRAM memory cell comprising:
  - a pair of nonvolatile resistive random access memory (RRAM) memory cells coupled to a volatile SRAM memory cell, the pair of nonvolatile RRAM memory cells comprising a first RRAM memory cell and a second RRAM memory cell,
  - the first RRAM memory cell comprising:
    - a first resistive memory element coupled to a first bit line, and
    - a first selector transistor coupled between the first resistive memory element and a first output node of the volatile SRAM memory cell;
      - the first selector transistor including a gate communicatively coupled to a selector word line, the selector word line to cause a transfer of logic state from the first output node of the volatile SRAM memory cell to the first RRAM memory cell prior to entry into a low power state; and
  - the second RRAM memory cell comprising:
    - a second resistive memory element coupled to a second bit line, and
    - a second selector transistor coupled between the second resistive memory element and a second output node of the volatile SRAM memory cell;
      - the second selector transistor including a gate communicatively coupled to the selector word line, the selector word line to cause a transfer of logic state from the second output node of the volatile SRAM memory cell to the second RRAM memory cell prior to entry into the low power sta.

8. The system of claim 7, wherein each resistive memory element occupies a plurality of adjacent back end layers of a monolithic integrated circuit.

9. The system of claim 7, wherein the first resistive memory element comprises a first positive electrode and a first negative electrode and the second resistive memory element comprises a second positive electrode and a second negative electrode.

10. The system of claim 9, wherein the first positive electrode is coupled to the first bit line and the second positive electrode is coupled to the second bit line.

11. The system of claim 9, wherein the first positive electrode is coupled to the first selector transistor and the second positive electrode is coupled to the second selector transistor.

12. The system of claim 7, wherein the first RRAM memory cell and the second RRAM memory cell are formed using an advanced CMOS (complementary metal oxide semiconductor) process.

13. The system of claim 12, wherein a minimum feature size is less than or equal to 20 nanometers (nm).

14. The system of claim 7, further comprising power management logic.

15. The system of claim 14, wherein the power management logic is to store data contained in the volatile SRAM memory cell to the pair of nonvolatile RRAM memory cells and to transition the volatile SRAM memory cell to the low power state.

16. The system of claim 15, wherein the power management logic is further to transition the volatile SRAM memory cell out of the low power state and to restore the data to the volatile SRAM memory cell.

* * * * *